(12) United States Patent
Odashima et al.

(10) Patent No.: US 8,322,533 B2
(45) Date of Patent: Dec. 4, 2012

(54) LID BODY FOR SUBSTRATE STORAGE CONTAINER AND SUBSTRATE STORAGE CONTAINER

(75) Inventors: Satoshi Odashima, Saitama (JP); Hidehiro Masuko, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 298 days.

(21) Appl. No.: 12/667,894

(22) PCT Filed: Jul. 4, 2008

(86) PCT No.: PCT/JP2008/062197
§ 371 (c)(1),
(2), (4) Date: Jan. 6, 2010

(87) PCT Pub. No.: WO2009/008375
PCT Pub. Date: Jan. 15, 2009

(65) Prior Publication Data
US 2010/0206767 A1 Aug. 19, 2010

(30) Foreign Application Priority Data

Jul. 11, 2007 (JP) .................................. 2007-182510
Aug. 22, 2007 (JP) .................................. 2007-215906

(51) Int. Cl.
*B65D 85/00* (2006.01)
*B65D 85/90* (2006.01)
(52) U.S. Cl. .......... 206/711; 206/1.5; 220/326; 292/163
(58) Field of Classification Search .......... 206/710–712, 206/326, 1.5; 292/175, 162–163; 49/465; 220/315, 323
See application file for complete search history.

(56) References Cited

U.S. PATENT DOCUMENTS 907,085 A * 12/1908 MoNutt .......................... 292/42
(Continued)

FOREIGN PATENT DOCUMENTS
JP 08-278548 A 10/1996
(Continued)

OTHER PUBLICATIONS

PCT Notification of Transmittal of Translation of the International Preliminary Report on Patentability mailed on Apr. 22, 2010, 6 pages.

(Continued)

*Primary Examiner* — Mickey Yu
*Assistant Examiner* — Chun Cheung
(74) *Attorney, Agent, or Firm* — Osha Liang LLP

(57) ABSTRACT

A substrate storage container includes a locking mechanism, provided in a lid for opening and closing an opened front portion of a container body which stores a substrate of three sheets or less, for locking the lid fitted into the front portion of the container body. The locking mechanism is supported by the lid which is substantially laterally long when viewed from the front. The locking mechanism includes an advance/retreat engaging body that opposes an inner periphery of the front portion of the container body when the lid is fitted into the front portion of the container body, and a spring member that causes the advance/retreat engaging body to advance from the lid to the inner periphery of the front portion of the container body and thus causes a tip end portion side thereof to interfere when the lid is fitted into the front portion of the container body.

7 Claims, 21 Drawing Sheets

U.S. PATENT DOCUMENTS

| | | | | | |
|---|---|---|---|---|---|
| 2,535,275 | A | * | 12/1950 | Dixon | 220/326 |
| 3,666,338 | A | * | 5/1972 | Russell | 220/326 |
| 6,105,782 | A | * | 8/2000 | Fujimori et al. | 206/710 |
| 7,108,135 | B2 | * | 9/2006 | Park | 206/711 |
| 7,325,693 | B2 | * | 2/2008 | Burns et al. | 206/710 |

FOREIGN PATENT DOCUMENTS

| | | | |
|---|---|---|---|
| JP | 2000-079739 A | 3/2000 |
| JP | 2001-015576 A | 1/2001 |
| JP | 2002-368074 A | 12/2002 |
| JP | 2006-100712 A | 4/2006 |
| JP | 2006-245206 A | 9/2006 |

OTHER PUBLICATIONS

International Search Report w/translation from PCT/JP2008/062197 dated Aug. 5, 2008 (2 pages)
Patent Abstracts of Japan, Publication No. 2006-245206, Publication Date: Sep. 14, 2006, 1 page.
Patent Abstracts of Japan, Publication No. 2002-368074, Publication Date: Dec. 20, 2002, 1 page.
Patent Abstracts of Japan, Publication No. 2001-015576, Publication Date: Jan. 19, 2001, 1 page.
Patent Abstracts of Japan, Publication No. 2006-100712, Publication Date: Apr. 13, 2006, 1 page.

* cited by examiner

LID BODY FOR SUBSTRATE STORAGE CONTAINER AND SUBSTRATE STORAGE CONTAINER

FIELD OF THE INVENTION

The present invention relates to a lid for a substrate storage container of a substrate storage container called a SMALL FOUP which stores a small number of sheets of substrates comprising a semiconductor wafer or the like, and a substrate storage container.

DESCRIPTION OF THE RELATED ART

A semiconductor wafer sliced to have a size of which diameter is 200 mm or 300 mm is to be applied various processing, and a processing time for the semiconductor wafer is not uniformly fixed but changes considerably depending on the performance of an IC chip, a timing of manufacturing a product, the specifications of a product, or the like.

For example, when a semiconductor wafer is processed by a memory device manufacturer or the like, especially when a target to be processed is a commodity, mass production is required and processing is applied through a number of procedures over a long period (for example, 30 to 40 days). Compared to this, when a semiconductor wafer is processed by a LSI manufacturer or the like, from the necessity to cope with requirements of high-mix low-volume production, production of a trial product, and a small-lot product, it is necessary to be processed within a short period (for example, 14 days to 20 days).

Therefore, as a semiconductor wafer, when processed in the LSI manufacturer or the like, it is preferable that a small number of sheets (for example, 1 to 3 sheets) thereof are stored in a dedicated substrate storage container, not in an existing substrate storage container capable of storing a plurality of sheets (for example, 25, 26 sheets) thereof, for reducing a processing time per sheet (see Patent Literature 1).

As this kind of dedicated substrate storage container, it has been considered to have a configuration provided with a unillustrated container body laterally long when viewed from the front, a lid laterally long when viewed from the front for opening and closing a laterally long opened front portion of the container body, and a locking mechanism to lock the lid fitted into the front portion of the container body is embedded in the lid. As the locking mechanism, it has been considered to have the configuration for the existing substrate storage container capable of storing a plurality of sheets of semiconductor wafers. Specifically, an existing configuration has been considered, in which a pair of advance/retreat movement plate in the lid is advanced as the rotary plate in the lid is operated and rotated by a lid opening/closing apparatus from the outside, and an engaging claw at the tip end portion of each advance/retreat plate is engaged on the inner periphery of the front portion in the container body (See Patent Literatures 2 and 3).

Patent Literature 1: Japanese Patent Application Laid-open No. 2006-245206
Patent Literature 2: Japanese Patent Application Laid-open No. 2002-368074
Patent Literature 3: Japanese Patent Application Laid-open No. 2006-100712

SUMMARY OF THE INVENTION

Problems to be Solved by the Invention

However, there is a problem that a dedicated substrate storage container for reducing a processing time per sheet of a semiconductor wafer is configured to be a smaller size having a lower height than the existing type, and a space for embedding the locking mechanism in the lid is narrow and scarce so that adapting the existing large locking mechanism is difficult.

Furthermore, there is a problem that the configuration of the lid opening/closing apparatus which opens and closes the lid becomes complicated since the existing locking mechanism requires the rotary plate in the lid to be operated and rotated from the outside. Additionally, when using the existing locking mechanism, although the lid fitted into the front portion of the container body can be locked firmly, there is a possibility that the rotation body is rotated freely so that the engaging claw is disengaged from the inner periphery of the front portion of the container body, even when the lid is not to be removed from the container body, thus there is a risk to cause a trouble in locking, opening and closing the lid.

The present invention has been made in view of the above, it is therefore an object of the present invention to provide a lid for a substrate storage container and a substrate storage container, that are capable of arranging the locking mechanism in a narrow space of the lid and of preventing complication of the lid opening/closing apparatus. Further, a lid for a substrate storage container and a substrate storage container, of which a risk to cause a trouble in locking, opening and closing the lid is lowered, are provided.

Means to Solve the Problems

In the present invention, to solve the above problems, in a lid for opening and closing an opened front portion of a container body which stores a substrate of three sheets or less, a locking mechanism that locks the lid fitted into the front portion of the container body is provided, wherein the locking mechanism is supported by the lid which is substantially laterally long when viewed from the front, and includes an advance/retreat engaging body that opposes an inner periphery of the front portion of the container body when the lid is fitted into the front portion of the container body, and a spring member that causes the advance/retreat engaging body to advance from the lid to the inner periphery of the front portion of the container body and thus causes a tip end portion side thereof to interfere, when the lid is fitted into the front portion of the container body.

Note that, the advance/retreat engaging body is able to include a driving member supported by the lid and capable of sliding in inward and outward right-and-left directions, and an engaging piece, provided on a tip end portion side of the driving member and being in contact with the inner periphery of the front portion of the container body by penetrating a through hole of a lid side portion when the lid is fitted into the front portion of the container body.

Furthermore, the advance/retreat engaging body is able to include a driving member supported by the lid and capable of sliding in inward and outward right-and-left directions and an engaging piece, rotatably supported by the lid and rotatably coupled with a tip end portion side of the driving member, and being in contact with the inner periphery of the front portion of the container body by penetrating a through hole of a lid side portion when the lid is fitted into the front portion of the container body.

In addition, the advance/retreat engaging body is also able to include a regulating member provided on the driving member and regulating an excessive advance thereof.

Further, the advance/retreat engaging body is possible to include an operation portion that is provided at least on either of the driving member or the regulating member and operable from the outside of the lid.

Additionally, it is possible that the engaging piece of the advance/retreat engaging body is bent-formed and a vicinity of a bent portion is rotatably supported by the inner peripheral edge of the lid, and thus causes a free end portion of the engaging piece, when the lid is fitted into the front portion of the container body, to project to a direction opposite to a direction in which the lid is fitted into.

Additionally, it is possible that a roller being in contact with the inner periphery of the front portion of the container body is rotatably supported by the engaging piece of the advance/retreat engaging body.

Furthermore, in the present invention, to solve the above problems, in a lid for opening and closing an opened front portion of a container body which stores a substrate of three sheets or less, a locking mechanism for locking the lid fitted into the front portion of the container body is provided, wherein the locking mechanism is supported by the lid which is substantially laterally long when viewed from the front, and includes a sliding body capable of sliding in inward and outward right-and-left directions thereof, an engaging claw supported so as to be projected to and retracted from in a vicinity of a through hole on a side wall of the lid, rotatably coupled with a tip end portion of the sliding body, projecting from the through hole of the lid and capable of interfering with an inner periphery of the front portion of the container body, a spring member that causes the sliding body to slide into outward right-and-left direction of the lid and thus causes the engaging claw to project from the through hole of the lid, and an operation hole provided on an end portion side of the sliding body and operated from the outside.

Note that, inside the lid, a guide, which guides by holding the sliding body of the locking mechanism in inward and outward right-and-left directions of the lid, is able to be formed.

Additionally, the lid includes a casing which is fitted into the opened front portion of the container body and embeds a locking mechanism, a surface plate which covers the opened front portion of the casing, and an operation port provided on the surface plate and opposing the operation hole of the sliding body, and on the casing, an elastically deformable gasket is able to be mounted which is interposed with the inner periphery of the front portion of the container body.

Additionally, the gasket includes an endless mounting portion to be mounted on the peripheral edge of the casing, and a contact portion formed on the mounting portion and in contact with the inner periphery of the front portion of the container body, and diamond-like carbon is able to be coated at least on the contact portion among the mounting portion and the contact portion.

Furthermore, the locking mechanism is possible to include a cylindrical body that is slidably fitted into the sliding body, and an arm that is rotatably coupled with the sliding body, supported by the lid and rotating in inward and outward right-and-left directions of the lid, and the spring member is interposed between a tip end portion side of the sliding body and the cylindrical body so that the cylindrical body is caused to be in contact with the arm.

Furthermore, it is possible that a roller is caused to be rotatably supported by an interfering portion of the engaging claw which interferes with the inner periphery of the front portion of the container body, and when the lid is removed from the front portion of the container body, the sliding body is caused to slide in inward right-and-left direction of the lid by operating the operation hole of the sliding body so that the projecting engaging claw is retracted into the through hole of the lid.

In addition, it is possible that the operation hole of the sliding body is formed into a substantially circular shape and a part positioned on inward right-and-left side of the lid may be formed into a linear, vertical flat portion, and when the lid is removed from the front portion of the container body, the sliding body is caused to slide in the inward right-and-left direction of the lid by inserting an operation pin to the operation hole of the sliding body so that the projecting engaging claw is retracted into the through hole of the lid.

Furthermore, it is preferable that the operation port of the lid is formed into laterally long extending in inward and outward right-and-left directions of the lid, and outward right-and-left direction side thereof is formed into a wide width portion, and a remaining portion positioned on inward right-and-left direction side is formed into a narrow width portion.

Additionally, it is preferable that the operation pin includes a pin portion which is a substantially columnar shape and to be inserted into the operation hole of the sliding body, and a bulged portion formed on the pin portion and bulged outwards in a width direction and interferes with the operation port of the lid.

Additionally, it is preferable that the operation pin includes a pin portion which is to be inserted into the operation hole of the sliding body, and a bulged portion formed on the pin portion and bulged outwards in a width direction and interferes with the operation port of the lid, and a part of the pin portion is formed into a shape corresponding to the operation hole of the sliding body.

Furthermore, in the present invention, to solve the above problems, a container body that stores a substrate of three sheets or less, and the lid for a substrate storage container according to any one of claims 1 to 7 which opens and closes the opened front portion, substantially laterally long when viewed from the front, of the container body are included.

In addition, in the present invention, to solve the above problems, a container body that stores a substrate of three sheets or less, and the lid for a substrate storage container according to any one of claims 8 to 15 which opens and closes the opened front portion, substantially laterally long when viewed from the front, of the container body are included.

Note that, when molding the container body using a molding material, a rib flange is molded at least on a rear wall among the rear wall and both side walls of the container body, and it is possible to cause the rib flange to substantially oppose to an ejection pin from the outside when releasing the container body from a die.

In here, a substrate in the scope of claims at least includes various glass substrates represented by silica glass or liquid crystal glass, photomask, aluminum disk, semiconductor wafer (200 mm, 300 mm, 450 mm, etc., in diameter) or the like. One sheet, two sheets, or three sheets of the substrates are stored in the container body.

The container body is not particularly required to be transparent, opaque, or translucent, however it is formed to have a lower height than the substrate storage container for storing 25, or 26 sheets of semiconductor wafers which is 300 mm in diameter. For example, when storing two sheets of substrates comprising a semiconductor wafer which is 300 mm in diameter, the height is 6 cm or less. This container body is molded to have a configuration in which at least a part of an external shape is formed by an insert component, for example, by inserting the insert component in the die and performing die clamping, and injecting the molding material into the clamped die. Specifically, by the insertion molding, the container body including a rear wall of which part is see-through is able to be formed.

The lid may be formed to be transparent, opaque, or translucent. In addition, it does not matter whether there is one of or more than one locking mechanism. The driving member and the engaging piece of the locking mechanism may be integrally formed or formed as a separate body. As the driving member and the engaging piece, various shapes of axis, plate body, or the like may optionally be used, and it is possible to cause the engaging piece to support a singular/a plurality of rollers rotatably. The term, rotation, herein used includes the rotation, swinging, or the like. The engaging piece is able to be formed into a shape having a substantially plate shape section, a wedge shape, J-shape, L-shape, T-shape, Y-shape, y-shape, a pin shape, or the like.

The regulating member of the locking mechanism may be provided at a rear portion or an end portion, etc., of the driving member. For the regulating member or the driving member, an operation member, which is an operation portion exposed from the lid, may be optionally provided, or the recessed portion as the operation portion for inserting the operation member from the outside of the lid may be provided. As the spring member, the majority of which is a coil spring, however when a similar action and effects are expected, other types of springs, such as a plate spring may be used.

The end portion side of the sliding body includes both the end portion and the most distal end portion. The gasket may be or may not be an endless wire such as a frame shape. In addition, the term, a substantially circular shape of the operation hole herein used, at least includes a circular shape, ellipse, oval shape, or the shape similar to these.

According to the present invention, for closing the opened front portion of the container body, as the lid is fitted into the opened front portion of the container body, the tip end portion side of the advance/retreat engaging body is projected from the lid by the spring member, and the tip end portion side of the advance/retreat engaging body interferes with the inner periphery of the front portion of the container body so that the lid fitted into the container body is locked.

Further, according to the present invention, for closing the opened front portion of the container body, as the lid is fitted into the opened front portion of the container body and a through-hole of the lid is opposed to the inside of the front portion of the container body, the sliding body is caused to slide in outward right-and-left direction of the lid by the spring member and the engaging claw is caused to rotate, so that the engaging claw is projected from the through-hole of the lid side wall and fitted into the inner periphery of the front portion of the container body, and by the fitting of the engaging claw, the front portion of the container body is closed and locked by the lid.

Effect of the Invention

According to the present invention, there is an effect that it is possible to provide a locking mechanism in a narrow space of the lid, and the complication of the lid opening/closing apparatus is possible to be prevented. Additionally, there is an effect that a risk to cause a trouble in locking the lid is small.

Furthermore, the engaging piece of the advance/retreat engaging body is bent-formed so that a bent portion is rotatably supported by the inner peripheral edge of the lid, and when fitting the lid into the front portion of the container body, the free end portion of the engaging body is projected into the direction opposite to the fitting direction of the lid, by the reactive force accompanied by the contact of the free end portion of the engaging piece with the inner periphery of the front portion of the container body, the lid is pushed away to the fitting direction, and the firm fitting of the lid and the locking are expected.

In addition, by causing the engaging piece of the advance/retreat engaging body to rotatably support the roller in contact with the inner periphery of the front portion of the container body, generation of dust, particles, or the like accompanied by the contact is possible to be suppressed by a simple configuration.

Further, when a guide for guiding a sliding body in inward and outward right-and-left directions of the lid by holding it, is formed, a possibility that the sliding body slides as inclined, or the position thereof moves off, etc., is reduced, and the locking of the lid to the container body is optimized.

Additionally, an operation port is formed into laterally long extending in inward and outward right-and-left directions of the lid and a outward right-and-left direction side thereof is formed into a wide width portion and the remaining portion positioned on the inward right-and-left direction side thereof is formed into a narrow width portion, when the sliding body of the locking mechanism is caused to slide by the operation pin, the operation pin is able to be smoothly guided to the inward right-and-left direction side of the lid.

Additionally, since the operation pin is formed by a pin portion which is a substantially columnar shape and to be inserted into the operation hole of the sliding body, and a bulged portion which is formed on the pin portion and bulged into the outward width direction to interfere with the operation port of the lid, the bulged portion is in contact with the operation port of the lid and exerts the supporting function, thus possibility to cause falling off of the lid in removing operation will be lowered.

Furthermore, by forming a part of the pin portion into a shape corresponding to the operation hole of the sliding body, the deformation of the operation hole accompanied by the repeated attaching and detaching operation is possible to be suppressed.

Figure 1:
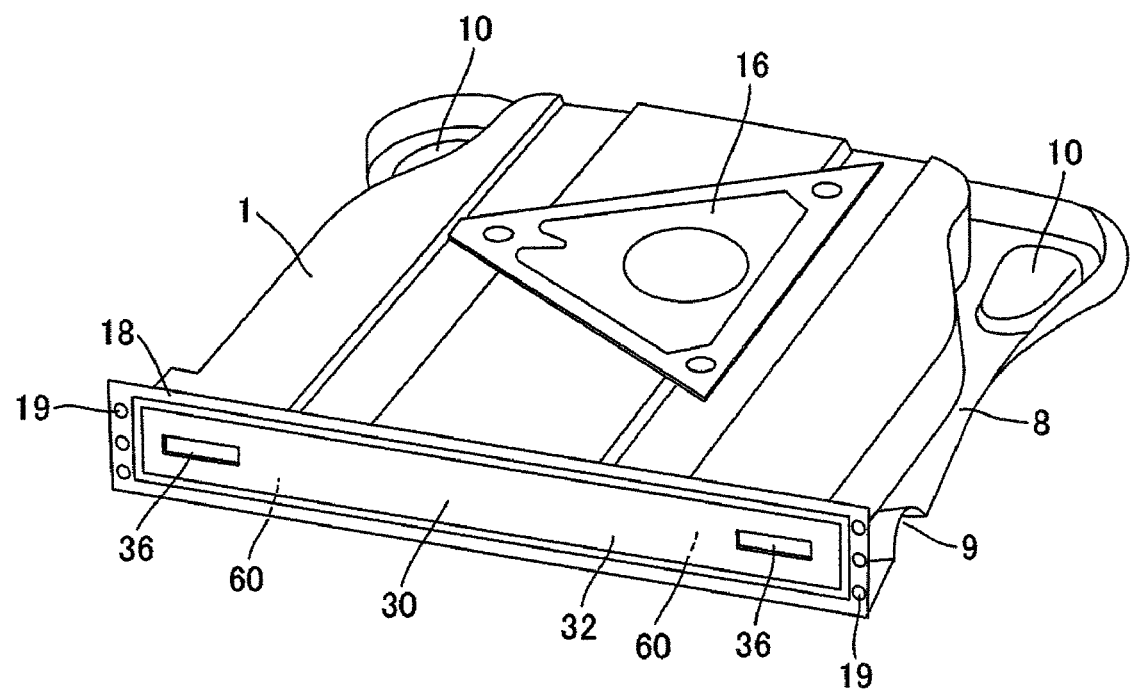
FIG. 1 is an illustrative perspective view schematically showing an embodiment of a lid for a substrate storage container and a substrate storage container according to the present invention.

EXPLANATIONS OF NUMERALS 1 container body
2 teeth body 6 teeth
7 flat plate
8 rib flange
16 hanging flange
17 engaging groove
18 rim flange
30 lid
31 casing
32 surface plate
34 front retainer
35 through-hole
36 operation port
41 guide piece (guide)
42 suction area
43 wide width portion
44 narrow width portion
50 gasket
51 mounting portion
52 contact portion
53 diamond-like carbon
60 locking mechanism
61 advance/retreat engaging body
62 coil spring (spring member)
63 driving member
64 engaging claw (engaging piece)
65 pin
66 operation hole (operation portion)
68 regulating stopper (regulating member)
70 operation projection portion (operation portion)
72 roller
73 link plate (sliding body)
74 collar (cylindrical body)
75 end portion
76 most distal end portion (end portion side)
77 link arm (arm)
78 vertically flat portion
81 die
87 ejection pin
90 operation pin
91 pin portion
92 bulged portion
93 vertically flat surface
W semiconductor wafer (substrate)

DESCRIPTION OF PREFERRED
EMBODIMENTS

Hereinafter, preferred embodiments of the present invention will be described with reference to the drawings. A substrate storage container of the present embodiment is provided, as shown in FIGS. 1 to 9, a laterally long when viewed from the front, opaque container body 1 for storing two sheets of semiconductor wafers W, a laterally long when viewed from the front, opaque lid 30 for opening and closing a laterally long opened front portion of the container body 1, and an elastic gasket 50 interposed between the container body 1 and the lid 30, and in the lid 30, a small locking mechanism 60 is embedded to lock when fitted into the opened front portion of the container body 1, and the locking mechanism 60 comprises a linear motion mechanism without having a rotation plate.

To efficiently produce, for example, IC chips, the semiconductor wafer W is sliced into a thin circular plate having a diameter of 300 mm (12 inches), on a surface of which a film such as an oxide film is selectively laminated and formed, and on a peripheral edge portion of which a notch, a substantially semicircular shape in a plan view, is selectively cut out for positioning and identification.

The container body 1, the lid 30 and the locking mechanism 60 are molded by a molding material, which is obtained by selectively adding carbon, carbon fibers, carbon nanotubes, metal fibers, metallic oxide, conductive high polymer, antistatic agent, fire retardant and the like to materials excellent in a mechanical property, heat resistance, dimensional stability and the like, such as polycarbonate, polybutylene terephthalate, cycloolefin polymer, polyether imide, polyether ketone, polyether ether ketone, polyacetal, polyoxymethylene, polyformaldehyde, and the like.

Figure 2:
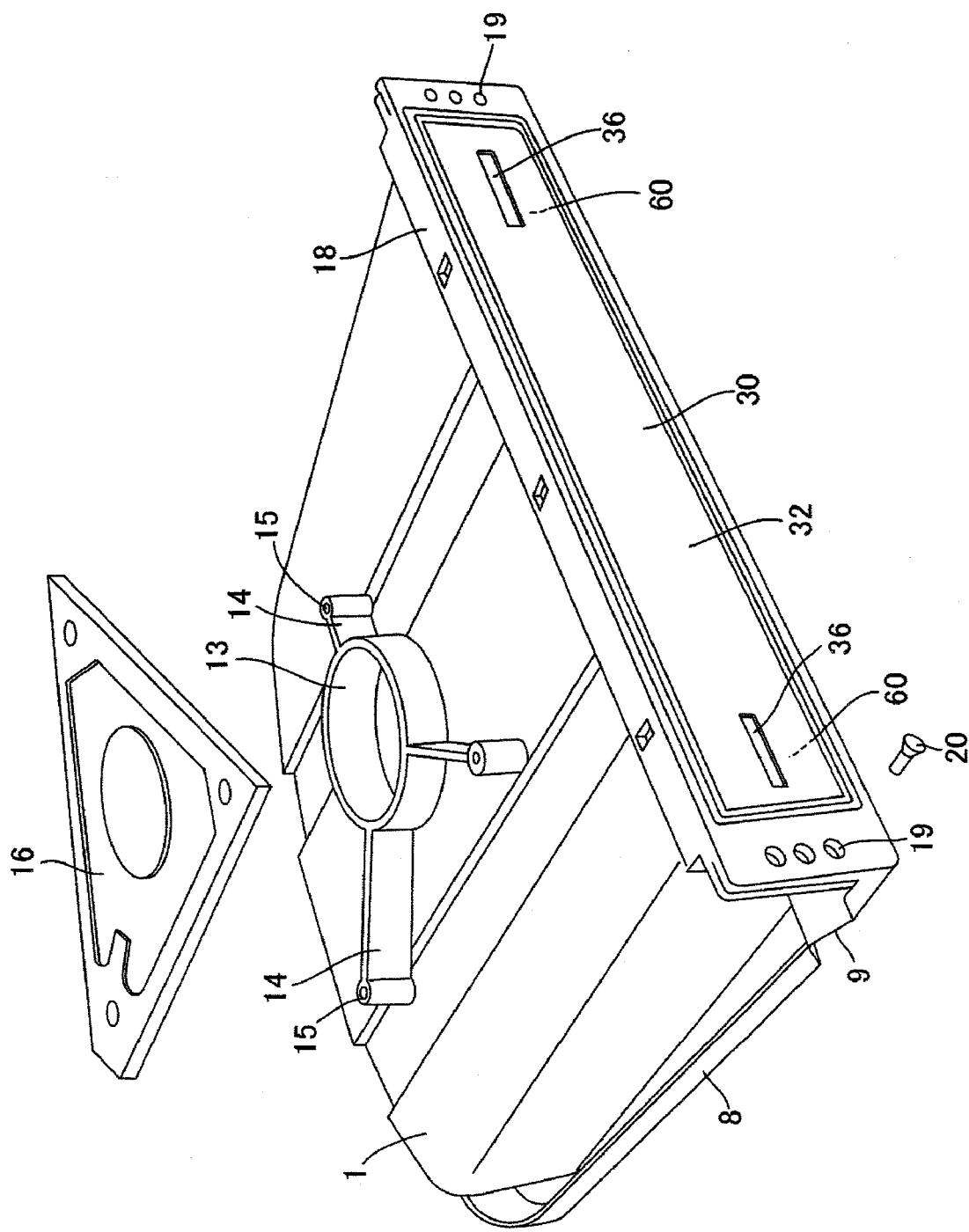
FIG. 2 is an illustrative exploded perspective view schematically showing an embodiment of a lid for a substrate storage container and a substrate storage container according to the present invention.

The container body 1 is, as shown in FIGS. 1 and 2, insert-molded using the molding material above into a front open box type and, with a ratio in length of a longer side to a shorter side of the front portion in a range from 1.6 to 25, has a space enough to align and store two sheets of semiconductor wafers W laid vertically. The container body 1 has a fitting groove 3 recessed and formed in a continuous belt-like shape for a teeth body 2 inside, specifically on the both side wall inner surfaces and the rear portion side of the inner bottom surface (see FIGS. 3 and 4).

Figure 3:
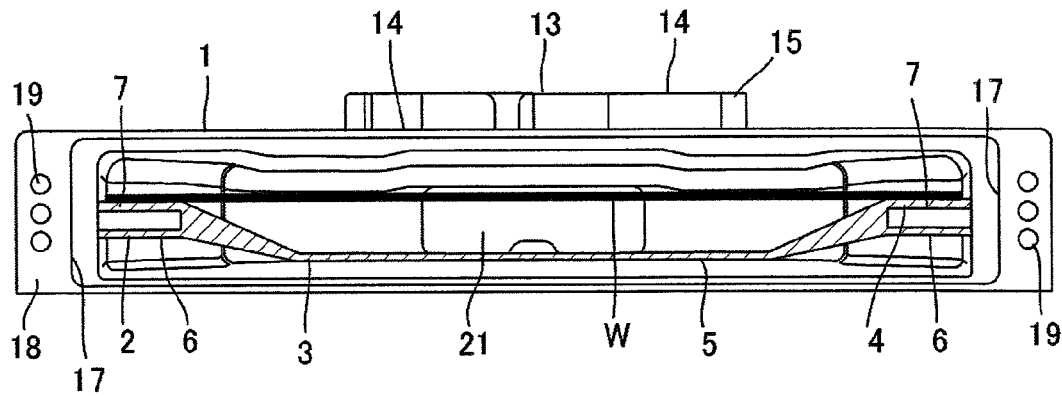
FIG. 3 is an illustrative front view schematically showing a container body in an embodiment of a substrate storage container according to the present invention.
Figure 4:
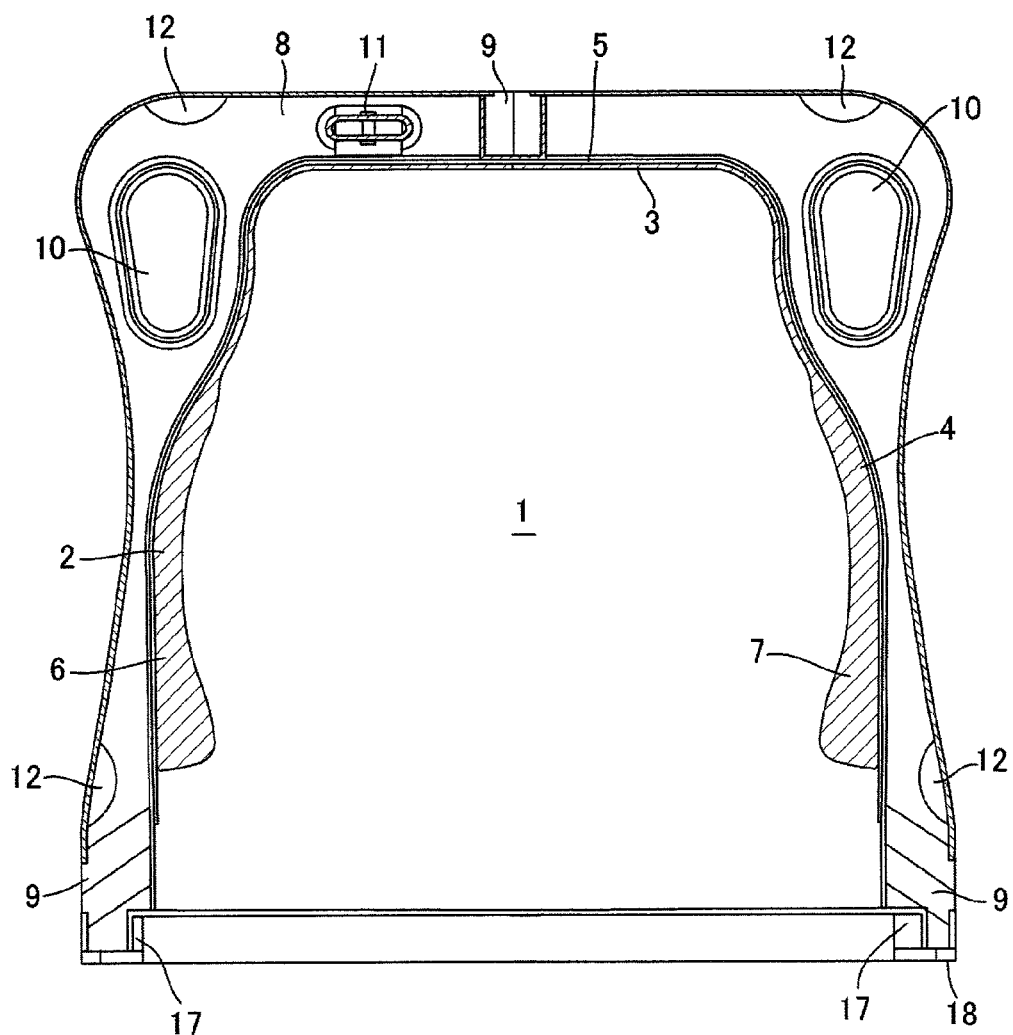
FIG. 4 is a cross-sectional plan view schematically showing a container body in an embodiment of a substrate storage container according to the present invention.

The teeth body 2 is provided with, as shown in FIGS. 3 and 4, a plurality of pairs of teeth 4 detachably fitted through the fitting groove 3 into the both side wall inner surfaces of the container body 1 for supporting the rear surface of the semiconductor wafer W at both side peripheral edge portions from below; and a coupling piece 5 detachably fitted through the fitting groove 3 into the inner bottom surface of the container body 1 by coupling thin end portions in the rear portion of the plurality of pairs of teeth 4, to be integrally molded into a substantially U-shape in a plan view as a whole and be injection-molded separately from the container body 1 before or after molding the container body 1. The plurality of pairs of teeth 4 are formed by disposing a pair of left and right teeth 6 for horizontally supporting the semiconductor wafers W at vertically predetermined intervals in a plurality of numbers.

As shown in FIG. 4, each teeth 6 is integrally formed with, for example, a front middle-depth area formed on a substantially semicircular shape in a plan view, flat plate 7 along a side peripheral edge of the semiconductor wafer W and on a bent front inner side of the flat plate 7, a front thick-depth area formed on a front outer side of the flat plate 7 and positioned on an outer side of the front middle-depth area, in other words, near a side wall of the container body 1, and a rear middle-depth area formed on the rear portion of the flat plate 7. Further, the coupling piece 5 is formed into a thin and long, substantially U-shape in a plan view, inclined downwards from the thin end portions of the plurality of teeth 6, positioned in the lower part of the rear wall of the container body 1 and functions to prevent interference with the rear peripheral edge of the semiconductor wafer W and the rear wall of container body 1.

The teeth 6 is formed with a small step between the front middle-depth area and the front thick-depth area for contact with the semiconductor wafer, while the front middle-depth and the rear middle-depth area support the rear surface of the semiconductor wafer at the side peripheral edge substantially horizontally, and the front thick depth area functions as a stopper for preventing the stored semiconductor wafer W from loosening out. By using such teeth 6, it is possible to improve a positional accuracy of mounting and supporting the semiconductor wafer Wand to effectively prevent the semiconductor wafer W from vertically inclining when supported.

The outer peripheral surface of the container body 1 is, as shown FIGS. 1, 2, 4 and 5, integrally formed with a rib flange 8 jutting horizontally outwards, and a peripheral edge portion of the rib flange 8 is erected to exert a reinforcement function. In the rear center and front both side portions of the rib flange 8, a positioning portion 9 for positioning an unillustrated semiconductor processing apparatus or lid opening/closing apparatus is each bent-formed to have a substantially U-shaped or substantially V-shaped section. Further, to the rear both sides of the rib flange 8, a balance weight 10 that functions as a counter weight or a balancer of the lid 30 is each attached.

Figure 5:
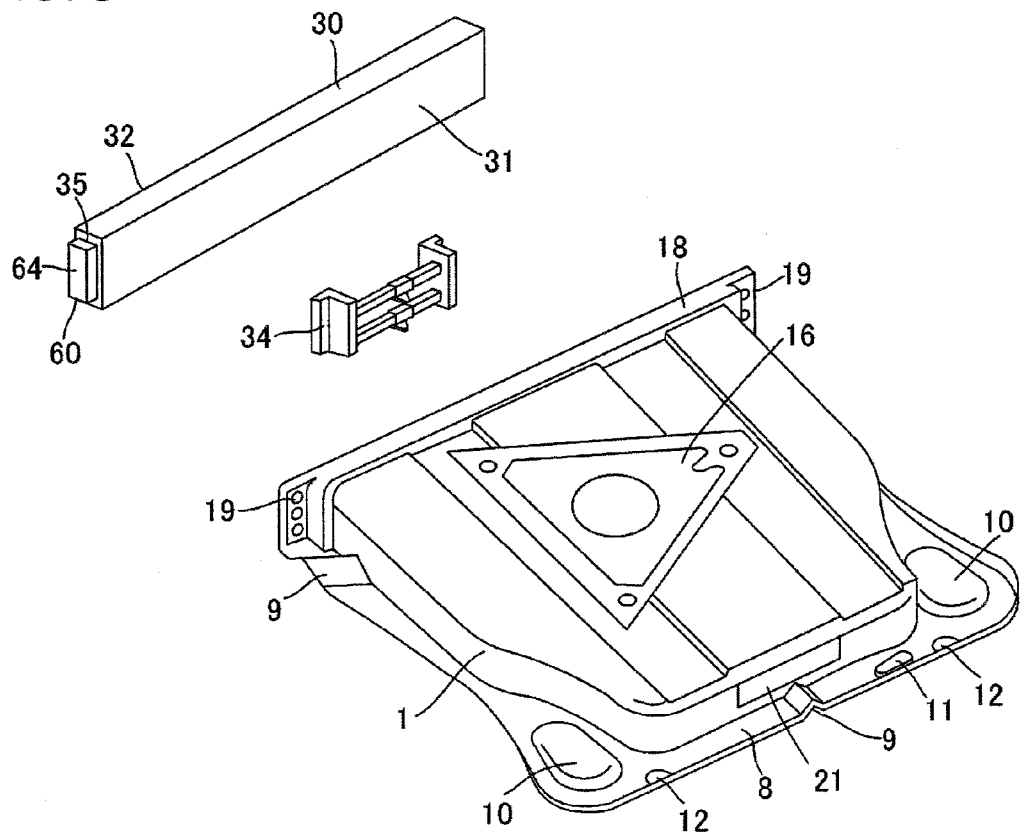
FIG. 5 is an illustrative perspective rear view schematically showing an embodiment of a lid for a substrate storage container and a substrate storage container according to the present invention.

From the rear center to the sides of the rib flange 8, as shown in FIGS. 4 and 5, an RF tag 11 constituting a RFID system is selectively attached and a plurality of water draining holes 12 that function in cleaning the container body 1 are formed at predetermined intervals. The RF tag 11 and the water draining holes 12 are disposed in the front, rear, or side portions of the rib flange 8 (see FIG. 4) as necessary.

A top of the container body 1 is formed to have a plurality of steps into a substantially polygon shape in a plan view, the rear both sides of which are each inclined inwards and formed so as to correspond to the rear peripheral edge of the semiconductor wafer W. In the top center portion of the container body 1, as shown in FIG. 2, a substantially cylindrical mounted rib 13 is erected, where a substantially plate-like reinforcement rib 14 is selectively plurally extended in a radial outer direction while being erected from the outer peripheral surface of the mounted rib 13, and at a tip end portion having a cylindrical shape of each reinforcement rib 14, a screw hole 15 is bored, and to the mounted rib 13 and the plurality of screw holes 15, a hanging flange 16 for transportation is horizontally screwed through a fastening tool such as a screw.

The hanging flange 16 is, as shown in FIGS. 1 and 2, formed into a substantially triangle in a plan view, flat plate and detachably held by an unillustrated transportation mechanism from above. The hanging flange 16 is fitted into and held by a slidable hanging plate of the semiconductor processing apparatus or the lid opening/closing apparatus, so that the substrate storage container is set to the semiconductor processing apparatus or the lid opening/closing apparatus while being hung.

The front portion of the container body 1 is opened and formed into a laterally long rectangle, and on both sides of the inner peripheral surface thereof, an engaging groove 17 for the lid 30 is each cut out vertically (see FIG. 4). A rim flange 18 is extended outwards from the front portion of the container body 1, as shown in FIGS. 1, 2, and 5, and on both sides thereof a plurality of round identification holes 19 are vertically aligned and bored and to the plurality of identification holes 19, detachable identification pins 20 are selectively inserted, so that the semiconductor processing apparatus or the lid opening/closing apparatus indentifies a type of the substrate storage container, presence/absence or the number of sheets of the semiconductor wafer W, and the like.

The identification pins 20 are formed, using a synthetic resin such as polycarbonate and the like, into a pin shape, a split pin shape, a screw shape, a cap shape and the like and are detected by detecting means of the semiconductor processing apparatus or the lid opening/closing apparatus, such as a transmission type or reflection type photoelectric sensor, photosensor, touch sensor, or the like.

As shown in FIGS. 3 and 5, on a part of the rear wall of the container body 1, for example, on the center portion of the rear wall, a transparent view window 21 is formed into a laterally long rectangle, and a viewer visually uses the view window 21 to observe presence/absence or a state of the stored semiconductor wafer W. The view window 21 is formed into a circular, elliptic, polygon shape or the like, as necessary.

The lid 30 having a substantially dish-like section to be detachably fitted into the opened front portion of the container body 1 includes a laterally long casing 31 and a laterally long surface plate 32 for detachably covering an opened front portion of the casing 31, and is configured to be able to correspond to automation of the semiconductor processing apparatus or the lid opening/closing apparatus.

Figure 6:
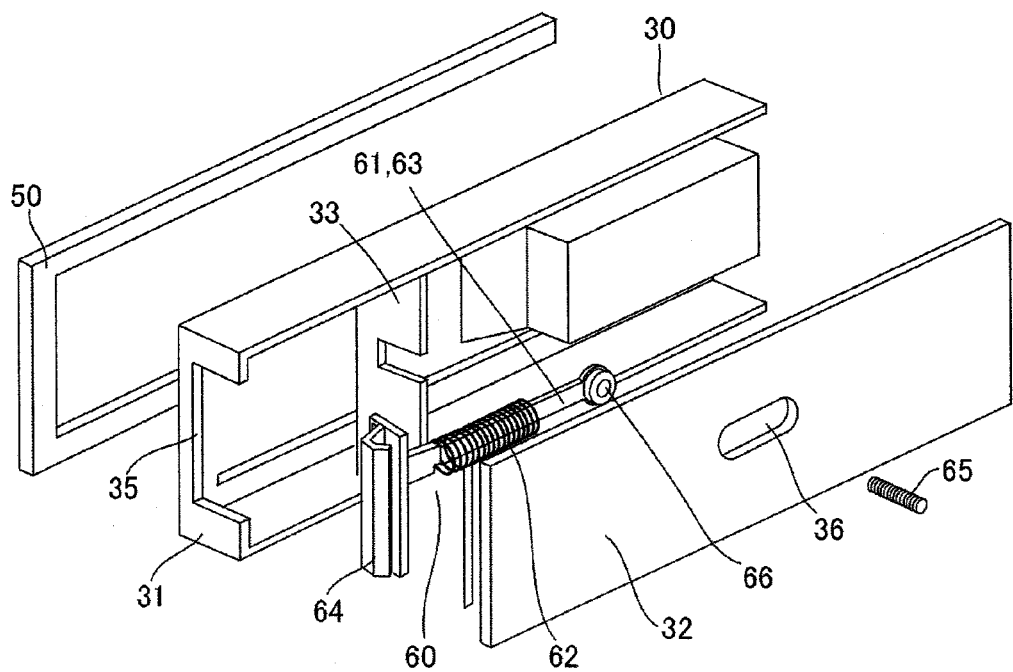
FIG. 6 is an illustrative exploded perspective view schematically showing a lid and a locking mechanism in an embodiment of a lid for a substrate storage container and a substrate storage container according to the present invention.

In the casing 31, as shown in FIGS. 5 and 6, a plurality of mounting ribs 33 having a substantially U-shape for a locking mechanism 60 are disposed on the inner both sides thereof and an elastic front retainer 34 for elastically holding the front peripheral edge of the semiconductor wafer W is detachably attached to the rear surface thereof. Further, on the peripheral wall both side portions of the casing 31, a through-hole 35 for the locking mechanism 60 is each bored into a rectangle and each through-hole 35 opposes the engaging groove 17 in the front portion of the container body 1.

A gasket 50 is molded using, for example, fluororubber, silicone rubber, or the like, into an elastically deformable endless frame, is held by both the inner periphery of the front portion of the container body 1 and the peripheral edge portion of the casing 31 constituting the lid 30 to be press-contacted and deformed, so as to exhibit an airtight function and prevent contamination of the semiconductor wafer W and particle generation.

Figure 7:
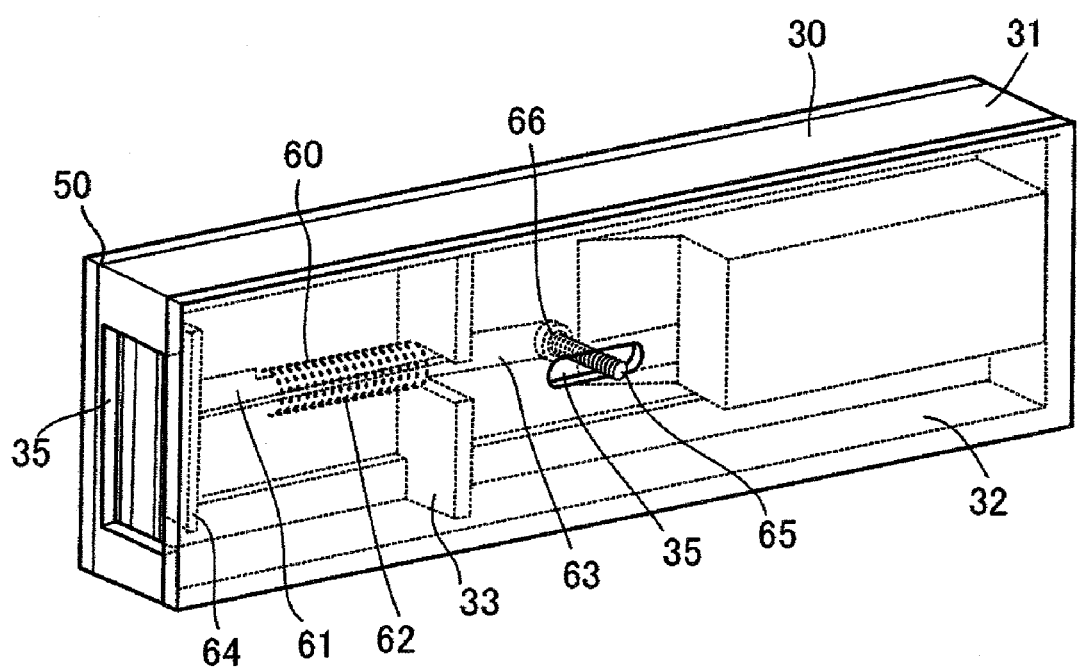
FIG. 7 is an illustrative perspective view schematically showing a lid and a locking mechanism in an embodiment of a lid for a substrate storage container and a substrate storage container according to the present invention.

The locking mechanism 60 is, as shown in FIGS. 6 and 7, supported on the inner both sides of the lid 30 and configured to be provided with a pair of advance/retreat engaging body 61 that opposes the engaging groove 17 of the container body 1 when the lid 30 is fitted into the front portion of the container body 1 and a pair of coil springs 62 that cause the advance/retreat engaging body 61 to advance to the engaging groove 17 of the container body 1 and thus causes a tip end portion thereof to interfere and be in contact when the lid 30 is fitted into the front portion of the container body 1.

Each advance/retreat engaging body 61 is provided with a driving member 63 that penetrates and is slidably supported by the mounting rib 33 of the casing 31 so as to be capable of horizontally sliding in inward and outward right-and-left directions of the lid 30, and to the tip end portion of the driving member 63, an engaging claw 64 for penetrating the through-hole 35 of the casing 31 and being fitted into the engaging groove 17 of the container body 1 is mounted, and at the end portion of the driving member 63 penetrating the mounting rib 33, a round operation hole 66 is bored for a pin 65 of the lid opening/closing apparatus, which has penetrated an operation port 36 of the surface plate 32 in the lid 30, to be inserted, and when the pin 65 of the lid opening/closing apparatus is inserted in the operation hole 66 and operated from the outside to slide, the advance/retreat engaging body 61 is slid to cause the projected engaging claw 64 to retract inside the casing 31.

As shown in FIG. 6, each coil spring 62 is penetrated into the center portion of the driving member 63 and interposed between the mounting rib 33 of the casing 31 and the engaging claw 64, and functions to elastically urge the engaging claw 64 to cause it to project from the through-hole 35 of the casing 31 so as to be projected from and retracted into when no load is applied. The coil spring 62 may be a metallic one such as SUS, beryllium copper, phosphor bronze and the like, or a resin one such as polyether ether ketone, polyacetal, polycarbonate and the like. Further, the surface of the metallic coil spring 62 may be coated with a resin component such as polyether ether ketone. Further, a leaf spring or the like may be used in place of the coil spring 62.

Figure 8:
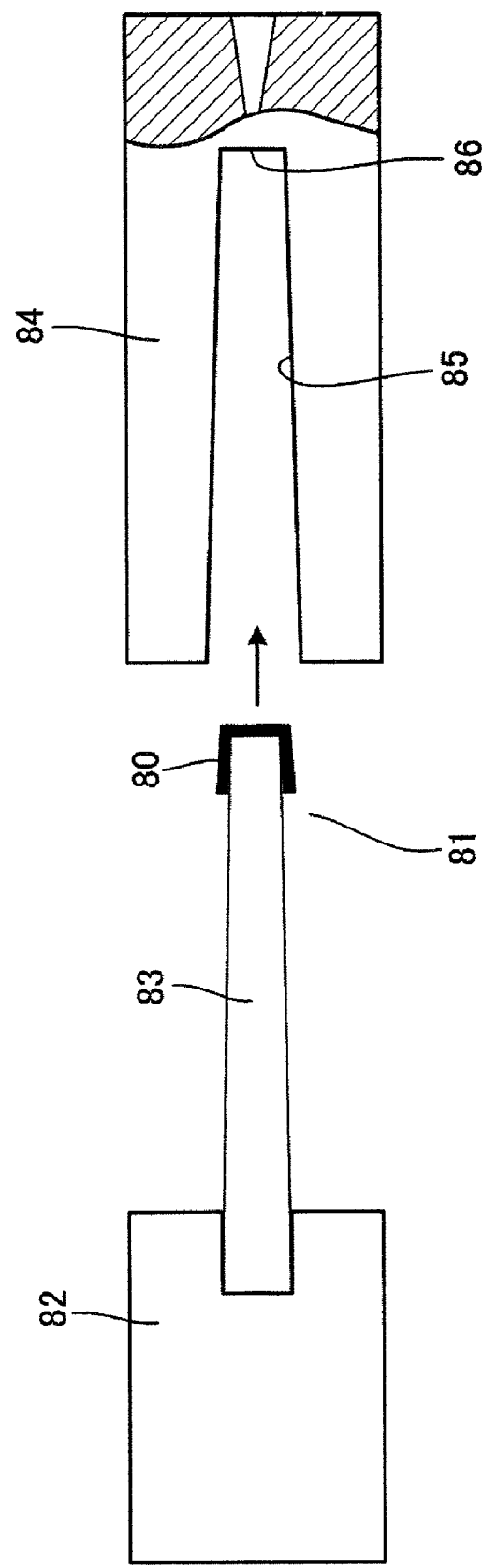
FIG. 8 is an illustrative partial cross-sectional view schematically showing a die for a container body in an embodiment of a substrate storage container according to the present invention.
Figure 9:
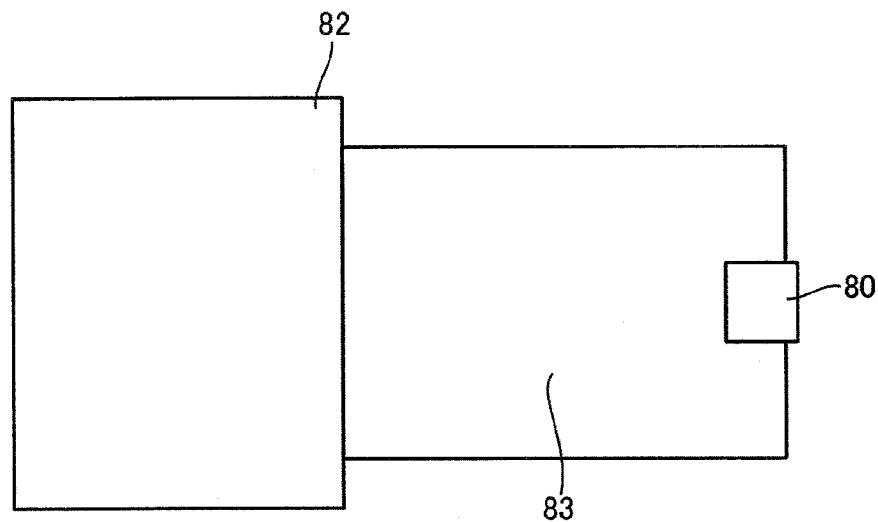
FIG. 9 is an illustrative plan view schematically showing a core die of a die in an embodiment of a substrate storage container according to the present invention.

In the above, to obtain the container body 1 of the substrate storage container, as shown in FIGS. 8 and 9, first, an insert component 80 that has been previously molded to form the rear portion of the container body 1, is fitted in and supported at a tip end portion of a core 83 that forms a core die 82 of a die 81, and the core die 82 is fitted in an opposing mirror-finished recessed portion 85 of a cavity die 84, so that the insert component 80 is inserted therein, as well as the insert component 80 is brought into contact with the end of a plurality of opposing walls 86 that partition the recessed portion 85, then the die 81 is clamped.

In this way, after the die 81 is clamped, a melted molding material is injected to the die 81 so that a hollow container body 1 is injection-molded so as the rear part integrally molded by the insert component 80, then the die 81 is dwelled and cooled while being clamped, and after the core die 82 and the cavity die 84 of the die 81 are opened, the container body 1 may be obtained by ejecting and dropping the container body 1 with an ejection pin 87 or an ejection plate, or transporting with a dedicated robot.

Next, the teeth body 2 is deformed and fitted in the molded container body 1 to be tightly fitted and positioned in a fitting groove 3, and the balance weight 10 is each embedded in the rear both sides of the rib flange 8 of the container body 1 and the RF tag 11 is attached to the rear side of the rib flange 8, and when the hanging flange 16 is screwed to the mounted rib 13 and the plurality of screw holes 15 of the container body 1, the container body 1 capable of storing two sheets of semiconductor wafers W with high accuracy is able to be completed.

Next, when the opened front portion of the container body 1 is closed and locked by the lid 30, first, the lid 30 is pressed by the lid opening/closing apparatus to be fitted into the opened front portion of the container body 1. Then, the engaging claw 64 of each advance/retreat engaging body 61 projected at both sides of the front portion of the container body 1 is brought into contact and retracted inside the lid 30. When the engaging claw 64 opposes the engaging groove 17 of the container body 1 and no load is applied, a restoration action of the compressed coil spring 62 causes the engaging claw 64 to linearly jut out from the through-hole 35 of the casing 31, so that the engaging claw 64 is fitted into the engaging groove 17 of the container body 1 to firmly lock the lid 30.

According to the above configuration, instead of using an existing large locking mechanism to be embedded, a small locking mechanism 60 is laterally arranged in the laterally long lid 30, therefore, the locking mechanism 60 is able to be mounted appropriately and easily in a narrow embedding space in the lid 30. Further, since the engaging claw 64 of each advance/retreat engaging body 61 is projected and retracted without a rotary plate to be operated and rotated from the outside, the omission of the rotary plate is able to easily eliminate a risk that a configuration of the lid opening/closing apparatus for opening and closing the lid 30 is complicated.

Further, whenever the lid 30 is fitted into the opened front portion of the container body 1, the engaging claw 64 is always fitted, due to urging of the coil spring 62, into the engaging groove 17 of the container body 1 to lock, thus it is possible to reliably prevent the lid 30 from falling off during transportation of the substrate storage container. Further, without complicating by integrally molding the container body 1 and the teeth body 2, the teeth body 2 of a complicated shape is later assembled on the simply-configured container body 1 as a separate body, thus it is possible to simply configure the die 81 and the mold opening of the die 81 for molding the container body 1 needs not be complicated, nor be the core die 82 divided, thus it is possible to remarkably simplify the configuration of the die 81.

Further, since the teeth body 2 as a separate body causes a degree of freedom of molding thereof to be improved, the degree of freedom of the shape of the teeth 6 is able to be significantly improved. Further, since the end portions of the plurality of pairs of teeth 4 are coupled with the coupling piece 5 to be integrated, there is no need that each teeth 6 is fitted in the container body 1 to be tightly fitted in the respective fitting groove 3, thus an assembling ability and a workability are expected to be improved, in addition to that, it is possible to expect improvement in a productivity, a mass-productivity and quality of the teeth body 2. Further, since the coupling piece 5 of the teeth body 2 is positioned below the viewing window 21 without being an obstacle crossing the viewing window 21, it is possible to ensure a good view for the viewer who uses the viewing window 21.

Further, since the insert component 80 supported by the tip end portion of the core 83 of the core die 82 is brought into contact with the recessed portion 85 of the cavity die 84 to regulate free vibration of the tip end portion of the flat core 83, even when there is a difference in injection pressure of the fluid molding materials, the core 83 of the core die 82 to be fitted in the cavity die 84 is neither flapped or deflected. Accordingly, it is possible to eliminate unevenness in thickness of the molded container body 1 in left, right, upward and downward directions, and to highly effectively prevent the core 83 of the core die 82 from swinging to be damaged. Further, since the insert component 80 is not only supported by the tip end portion of the core 83, but also fitted thereto to secure a position and posture thereof during molding, the container body 1 is able to be molded in high quality.

Figure 10:
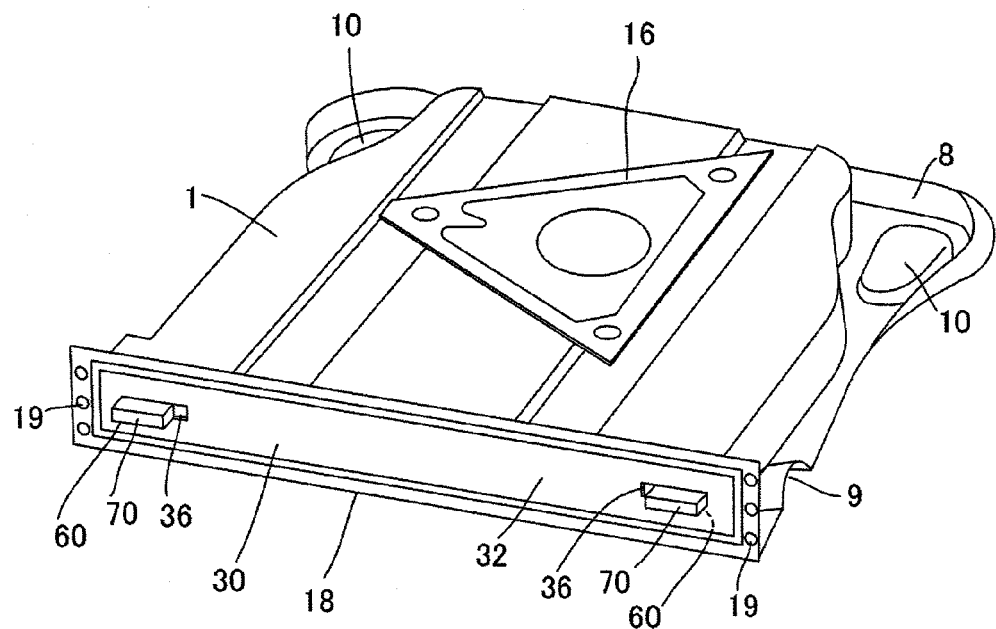
FIG. 10 is an illustrative overall perspective view schematically showing the second embodiment of a lid for a substrate storage container and a substrate storage container according to the present invention.
Figure 11:
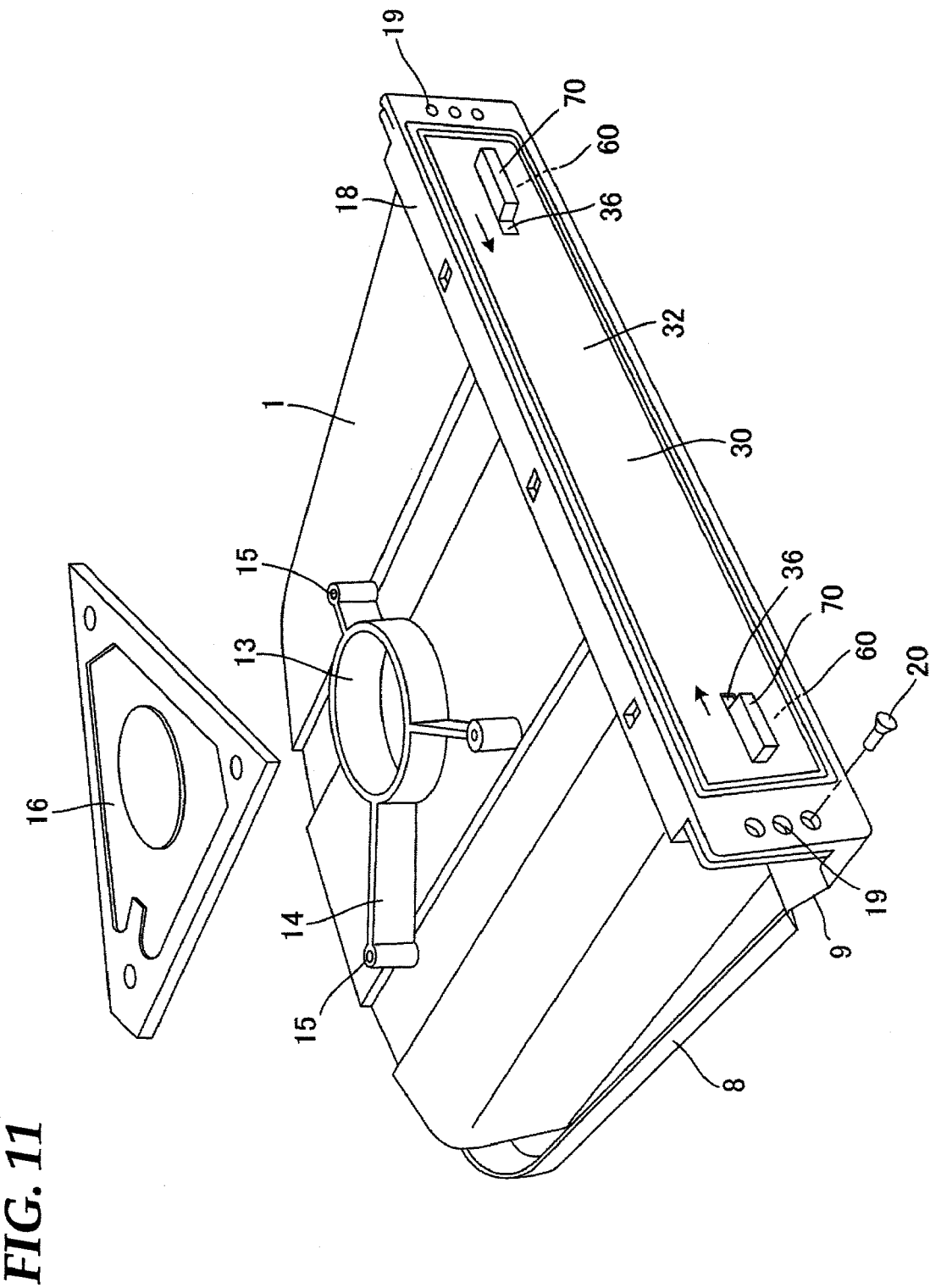
FIG. 11 is an illustrative exploded perspective view schematically showing the second embodiment of a lid for a substrate storage container and a substrate storage container according to the present invention.
Figure 12:
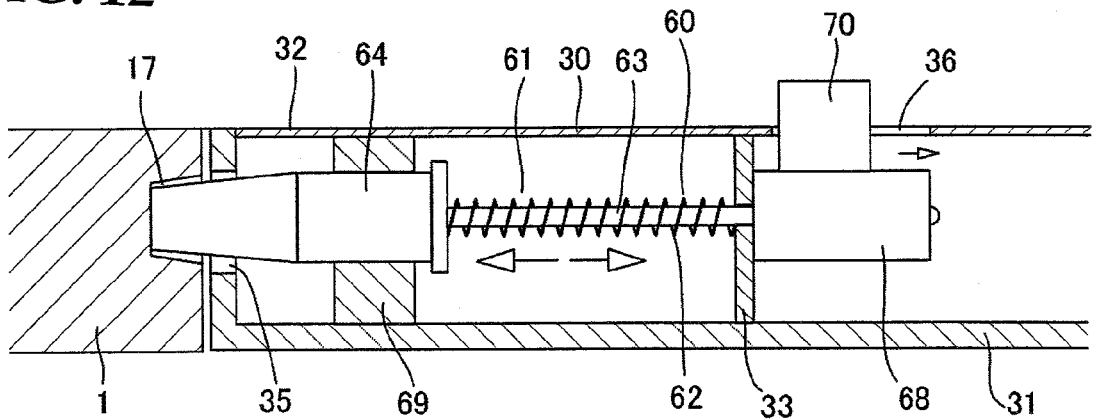
FIG. 12 is an illustrative cross-sectional view schematically showing a locking mechanism in the second embodiment of a lid for a substrate storage container and a substrate storage container according to the present invention.

Next, FIGS. 10 to 12 show a second embodiment of the present invention, where each advance/retreat engaging body 61 for this case includes a SUS driving member 63 slidably penetrated and supported by a mounting rib 33 of a casing 31 and at the tip end portion of the driving member 63, a tapered engaging claw 64 for penetrating a through-hole 35 of the casing 31 to be fitted in an engaging groove 17 of the container body 1, at the end portion of the driving member 63 penetrating the mounting rib 33, a regulating stopper 68 is screwed to regulate excessive advance of the driving member 63 by bringing into contact with the mounting rib 33 of the casing 31 in a manner capable of contacting and separating.

To the engaging claw 64, a guide 69 protruded from inside the casing 31 is loosely inserted, and to the regulating stopper 68, an operation projection portion 70 that loosely penetrates an operation port 36 of a surface plate 32 to be exposed is formed, and when the operation projection portion 70 is operated from the outside to slide, the advance/retreat engaging body 61 is slid to cause the projected engaging claw 64 to retract inside the casing 31. Since the other part is substantially similar to the above-mentioned embodiment, description will be omitted.

In the present embodiment, it is possible to expect the similar action and effects as in the above-mentioned embodiment and in addition, it is obvious that the configuration of the advance/retreat engaging body 61 and the operation portion are able to be diversified.

Figure 13:
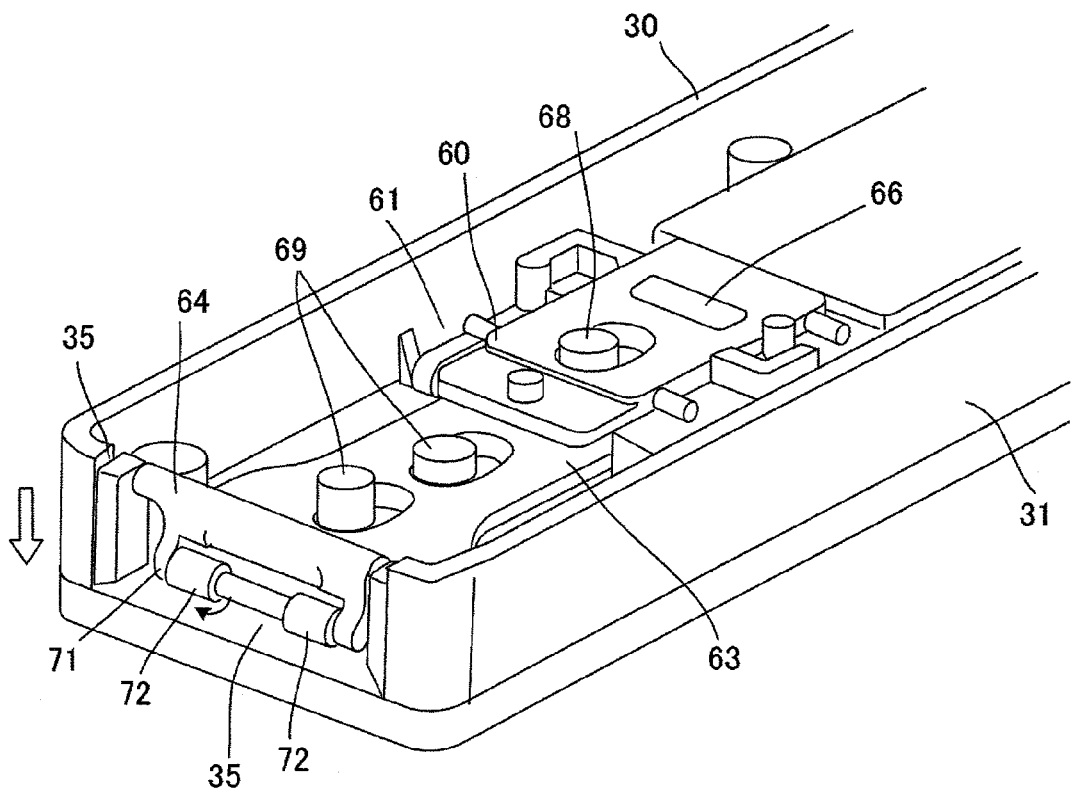
FIG. 13 is an illustrative perspective view schematically showing a locking mechanism in the third embodiment of a lid for a substrate storage container and a substrate storage container according to the present invention.

Next, FIG. 13 shows a third embodiment of the present invention and in this case, an advance/retreat engaging body 61 of a locking mechanism 60 is configured to be provided with a driving member 63 that is supported inside the casing 31 of the lid 30 and is capable of sliding horizontally in inward and outward right-and-left directions, an engaging claw 64 that is swingably and pivotally supported by both side portions of the peripheral wall of the lid 30, is coupled with a tip end portion of the driving member 63 and is fitted through a through-hole 35 of the casing 31 into an engaging groove 17 of the container body 1 when the lid 30 is fitted into the front portion of the container body 1, and a regulating stopper 68 that is disposed with the driving member 63 to regulate an excessive advance thereof.

The driving member 63 may be a thin long shaft, or a plate guided by a plurality of guides 69 as shown in the same figure, or a plurality of plates to be assembled. Further, pins are mounted on each of the both sides of the driving member 63 and may be guided by a guide disposed in the casing 31 so as to be in contact with each pin. Between the rear surface of the driving member 63 and the casing 31, an unillustrated spring member is compressed and interposed and the spring member presses the driving member 63 in the tip end direction, in other words, in a direction to the engaging claw 64.

The engaging claw 64 is bent and formed into a substantially L-shape and a bent portion thereof is swingably and pivotally supported in a vicinity of the through-hole 35 of the lid 30, and in a slightly curved free end portion 71, where a plurality of rollers 72 that are in slidingly contact with a front portion side 22 of the engaging groove 17 of the container body 1, are rotatably and pivotally supported through a supporting shaft, and an end portion thereof is rotatably and pivotally coupled with and supported by the tip end portion of the driving member 63. The roller 72 may be of a cylindrical shape, or may be formed into a cylinder having a polygon section so as to be engaged with the lid 30 more safely and reliably by bringing the flat surface into press-contact with the engaging groove 17 of the container body 1.

When the lid 30 is fitted into the front portion of the container body 1, such an engaging claw 64 projects out due to urging of the spring member in an opposite direction to a direction in which the roller 72 at the free end portion is fitted to the lid 30 as shown in FIG. 13 (see the arrow in the figure).

When the opened front portion of the container body 1 is closed and locked by the lid 30, the lid 30 is pressed by the lid opening/closing apparatus and fitted into the opened front portion of the container body 1. Then, the engaging claw 64 of each advance/retreat engaging body 61 being projected at both sides of the front portion of the container body 1 is brought into contact therewith to retreat inside the lid 30 while swinging. When the engaging claw 64 of the container body 1 opposes the engaging groove 17 of the container body 1 and a load is not applied any more, the engaging claw 64 is swingably projected (see the arrow of FIG. 13) from the through-hole 35 of the casing 31 due to a restoration action of the compressed spring member, so that the engaging claw 64 is fitted into the front portion side 22 of the engaging groove 17 to strongly lock the lid 30. Since the other parts are substantially similar to the above-mentioned embodiment, description will be omitted.

In the present embodiment, it is possible to expect the similar effects as in the above-mentioned embodiment, and in addition, when the lid 30 is fitted into the front portion of the container body 1, the roller 72 of the engaging claw 64 projects out in a direction opposite to a fitting direction of the lid 30 to be fitted into and in contact with the front portion side 22 of the engaging groove 17 and due to such a reactive force accompanied by being fitted in and contact, the lid 30 is strongly pressed in a fitting direction to the container body 1, so that it is obvious that firm fitting and locking by the lid 30 is able to be much expected. Further, since the engaging claw 64 is not directly brought into contact with the engaging groove 17 of the container body 1, but the rotating roller 72 is rotatively brought into contact therewith, it is obvious that particle generation accompanied by contact with the engaging claw 64 is able to be effectively prevented.

Figure 14:
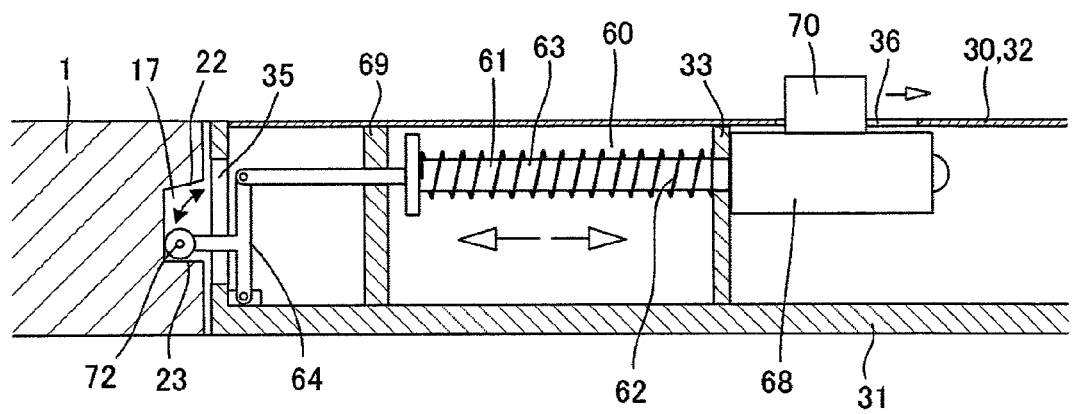
FIG. 14 is an illustrative cross-sectional view schematically showing a locking mechanism in the fourth embodiment of a lid for a substrate storage container and a substrate storage container according to the present invention.

Next, FIG. 14 shows a fourth embodiment of the present invention, and in this case, an engaging claw 64 of an advance/retreat engaging body 61 is bent-formed into a substantially T-shape, such that an edge portion thereof is swingably and pivotally supported in a vicinity of a through-hole 35 of the lid 30, and a plurality of rollers 72 that are in slidingly contact with the rear surface portion side 23 opposing to the front surface portion side 22 of the engaging groove 17 are rotatably and pivotally supported by a free end portion of the engaging claw 64, as well as, an end portion of the engaging claw 64 is rotatably and pivotally coupled with and supported by a tip end portion of the driving member 63. Since the other part is substantially the similar as the above-mentioned embodiment, description will be omitted.

In the present embodiment, it is possible to expect the similar effects as in the above-mentioned embodiments and in addition, it is obvious that the configuration of the advance/retreat engaging body 61 and the engaging claw 64 is able to be diversified.

Next, FIGS. 8, 15 through 33 show a fifth embodiment of the present invention, in this case, a locking mechanism 60 of a lid 30 for opening and closing the opened front portion of the container body 1 is formed to include a pair of link plates 73 capable of sliding in inward and outward right-and-left directions of the lid 30, a pair of engaging claws 64 that projects from a through-hole 35 of the lid 30 so as to be capable of interfering with an engaging groove 17 of the container body 1, a pair of coil springs 62 that slides each link plate 73 in outward right-and-left direction of the lid 30 to cause the engaging claw 64 to project from the through-hole 35 of the lid 30, and a pair of operation holes 66 to be operated from the outside of the lid 30.

Figure 18:
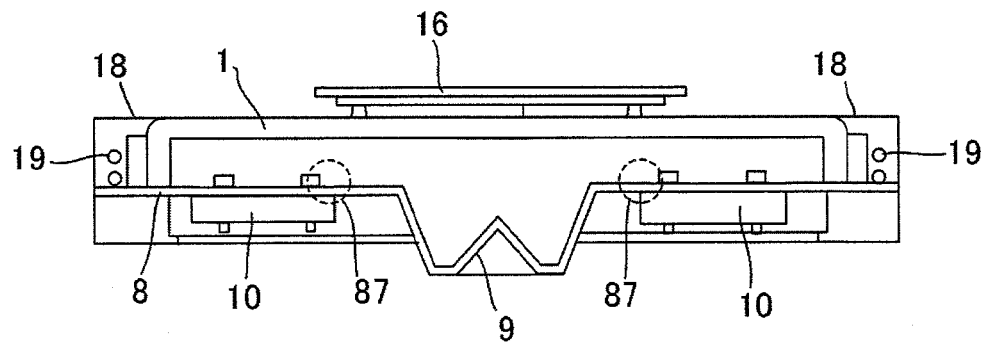
FIG. 18 is an illustrative rear view of FIG. 15.
Figure 19:
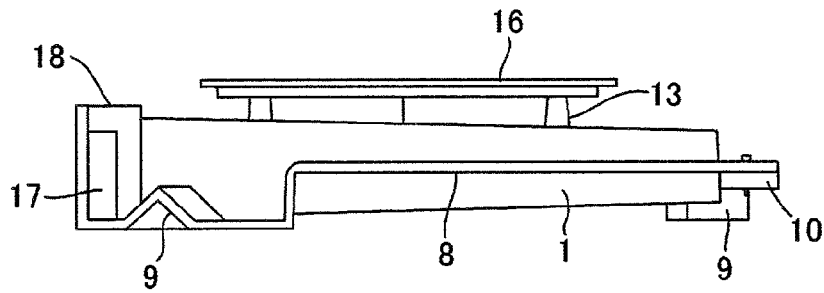
FIG. 19 is an illustrative side view of FIG. 15.
Figure 20:
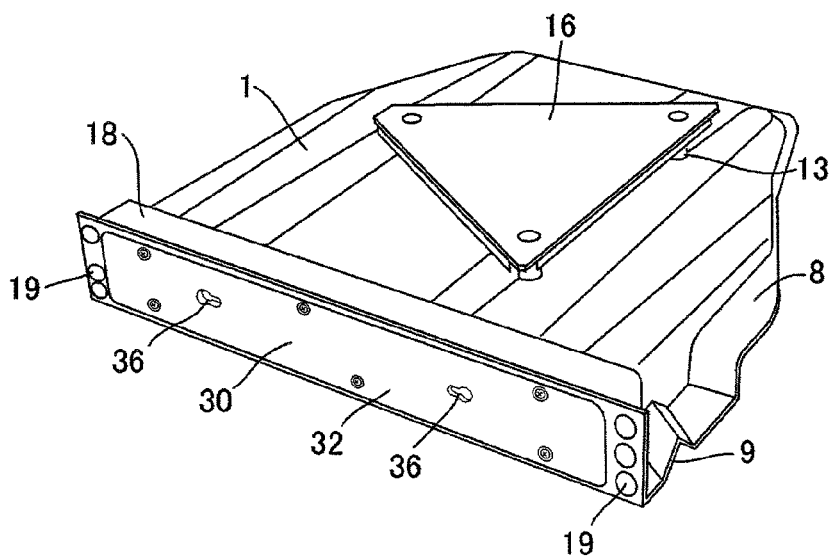
FIG. 20 is an illustrative perspective view of FIG. 15.
Figure 21:
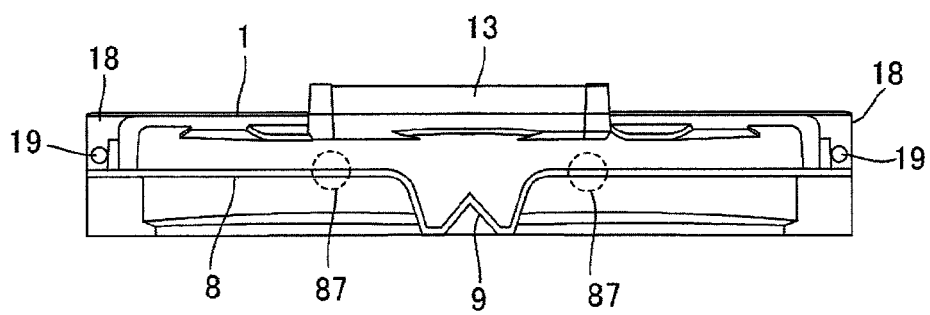
FIG. 21 is an illustrative rear view schematically showing a container body in the fifth embodiment of a lid for a substrate storage container and a substrate storage container according to the present invention.

As shown in FIG. 8, FIGS. 15 through 24 and the like, the container body 1 is injection-molded, by injecting a molding material containing a predetermined resin to the die 81 for molding, into a front open box type that is low in height (for example, 6 cm or less), aligns and stores two sheets or less semiconductor wafers W, and the opened laterally long front portion is detachably fitted by the lid 30 having the same shape thereof through an endless gasket 50. For the die 81, the one of an injection-molding type is used and attached to an injection molding machine. In the die 81, as shown in FIGS. 18 and 21, a plurality of ejection pins 87 capable of reciprocating to project out as the die is opened, are incorporated as they are fixed on a projection plate.

Figure 22:
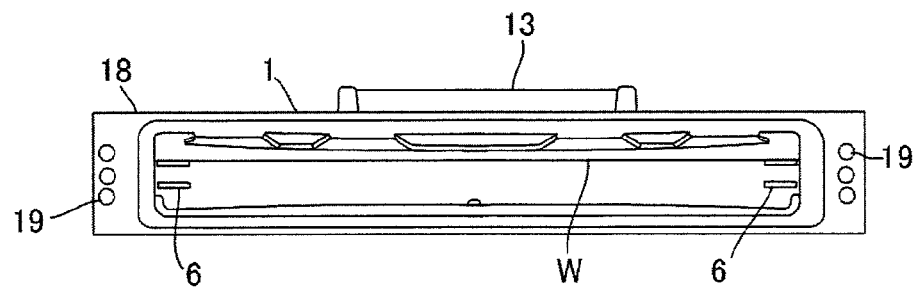
FIG. 22 is an illustrative front view of FIG. 21.
Figure 23:
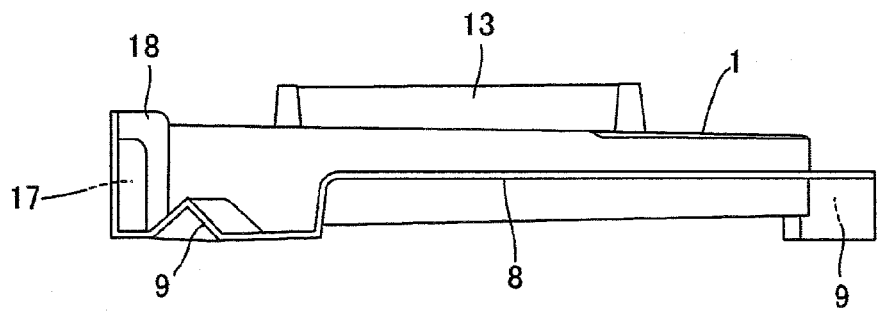
FIG. 23 is an illustrative side view of FIG. 21.
Figure 24:
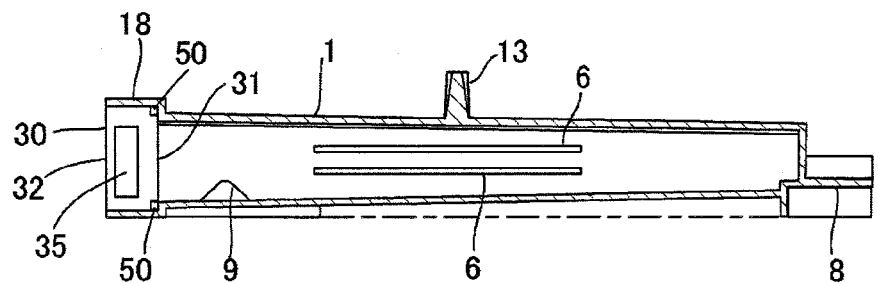
FIG. 24 is a cross-sectional side view of FIG. 21.

Inside the container body 1, specifically on the inner surface of the opposing both side walls, as shown in FIGS. 22 and 24, a pair of left and right teeth 6 that horizontally support the semiconductor wafer W are opposingly disposed and the pair of teeth 6 are arranged vertically at intervals. Each teeth 6 is formed in front to rear direction of the container body 1 into an elongated plate, the end portion of which is tapered near the rear wall of the container body 1. Further, on the outer peripheral surface of the container body 1, as shown in FIGS. 15, 16, 19 through 23, a rib flange 8 is formed to enhance the mechanical strength and the rigidity of the container body 1, and when the container body 1 is released from the die, the rib flange 8 on the rear wall side of the container body 1 is opposed to the ejection pin 87 of the die 81.

The rib flange 8 is integrally molded with the rear wall and both side walls of the container body 1 externally and has a deformed, substantially U-shape in a plan view. The rib flange 8 on the rear wall of the container body 1 is formed into, for example, an elongated thick plate, the both side portions of which are positioned horizontally in the substantial center of the rear wall both side portions of the container body 1, and the center portion of which is positioned below the rear wall center portion of the container body 1. Further, to prevent the front portion of the container body 1 from inclining downwards, a metallic balance weight 10 is screwed later from below each to the both side portions of the rib flange 8 of the rear wall and functions to externally oppose the plurality of ejection pins 87 when the container body 1 is released from the die 81.

The center portion of the rib flange 8 on the rear wall of the container body 1 is bent-formed into a substantially W-shape to have a recessed portion, and an opening port of this recessed portion is directed downwards to function as a positioning portion 9 to the container body 1 to the semiconductor processing apparatus or the lid opening/closing apparatus. Further, the rib flange 8 on each side wall of the container body 1 is formed into, for example, an elongated thick plate, the front portion of which is positioned below each side wall front portion, and other remaining portion than the front portion is positioned horizontally in a substantial center of the other remaining portion than the front portion on each side wall to be integrated with the rib flange 8 on the rear wall. The front portion of the rib flange 8 on each side wall is bent into a substantial inverted V-shape and formed to have a recessed portion, and an opening portion of this recessed portion is directed downwards to function as the positioning portion 9 of the container body 1 to the semiconductor processing apparatus or the lid opening/closing apparatus.

In the top center portion of the container body 1, as shown in FIGS. 15, 18 through 24 and the like, a plurality of mounted ribs 13 having a substantial Y-shape in a plan view are erected and on the plurality of mounted ribs 13, a hanging flange 16 having a substantially triangle or polygon shape in a plan view to be held by an unillustrated transportation mechanism is later detachably screwed through fastening tools such as screws.

The opened front portion of the container body 1 is bent-formed to spread outwards and form a rim flange 18, and on the inner both sides of this rim flange 18, each engaging groove 17 for locking the lid 30 is cut out in a top to bottom direction. On the both sides extended left and right from the rim flange 18, a plurality of identification holes 19 are bored round such that each is aligned in top to bottom direction, and an identification pin 20 is selectively inserted into the plurality of identification holes 19, as well as is detected by a detecting means (for example, photoelectric sensor, photosensor, touch sensor or the like), thereby the semiconductor processing apparatus or the lid opening/closing apparatus identifies presence/absence or the number of sheets of the semiconductor wafers W, a type of substrate storage container and the like.

The lid 30 is, as shown in FIGS. 17, 25, 26, 30, 31 and the like, is configured to be provided with a laterally long casing 31 that is detachably fitted into the opened front portion of the container body 1 and a transparent surface plate 32 that is screwed to an opened front portion of the casing 31 to cover. The casing 31 has a plurality of holding ribs 37 for a locking mechanism 60 each integrally projected and formed on the inner both sides, and on the both side portions of the peripheral wall, a through-hole 35 for the locking mechanism 60 corresponding to the engaging groove 17 of the container body 1 is each cut out, and in a vicinity of the inner peripheral edge of each through-hole 35, a supporting rib 38 for the locking mechanism 60 is integrally projected and formed.

Figure 26:
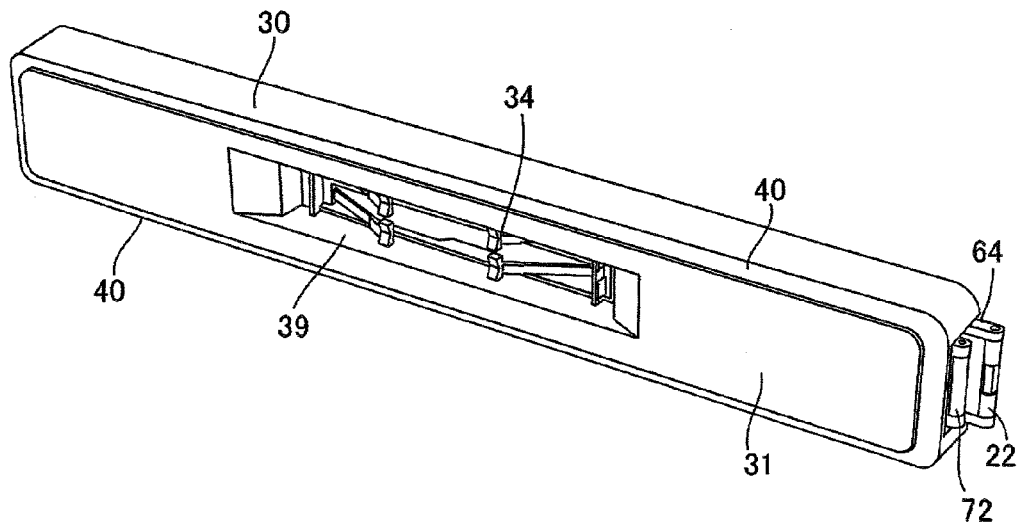
FIG. 26 is an illustrative perspective view schematically showing a rear surface of a lid in the fifth embodiment of a lid for a substrate storage container and a substrate storage container according to the present invention.

In the center portion of the rear surface of the casing 31, as shown in FIG. 26, laterally long mounting hole 39 is formed in recess and to this mounting hole 39, a front retainer 34 that resiliently holds the front peripheral edge of the plurality of semiconductor wafers W by an elastic piece is attached. Further, on the rear peripheral edge portion of the casing 31, as shown in FIG. 26, a mounting groove 40 having a laterally long frame-like shape is cut out and into the mounting groove 40, an elastic gasket 50 interposed with the front portion of the container body 1 is fitted.

Figure 27:
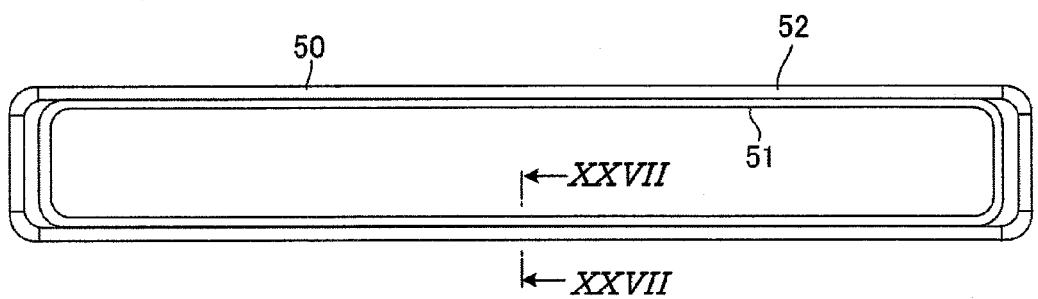
FIG. 27 is an illustrative front view schematically showing a gasket in the fifth embodiment of a lid for a substrate storage container and a substrate storage container according to the present invention.
Figure 28:
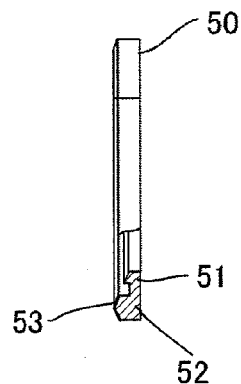
FIG. 28 is a partial cross-sectional side view schematically showing the gasket of FIG. 27.
Figure 29:
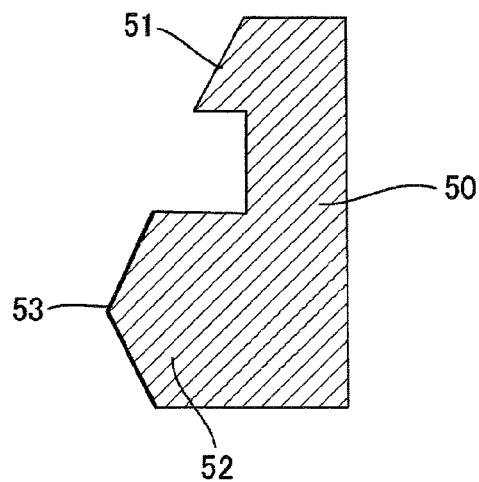
FIG. 29 is a cross-sectional view taken along a XXVII-XXVII line of FIG. 27.
Figure 30:
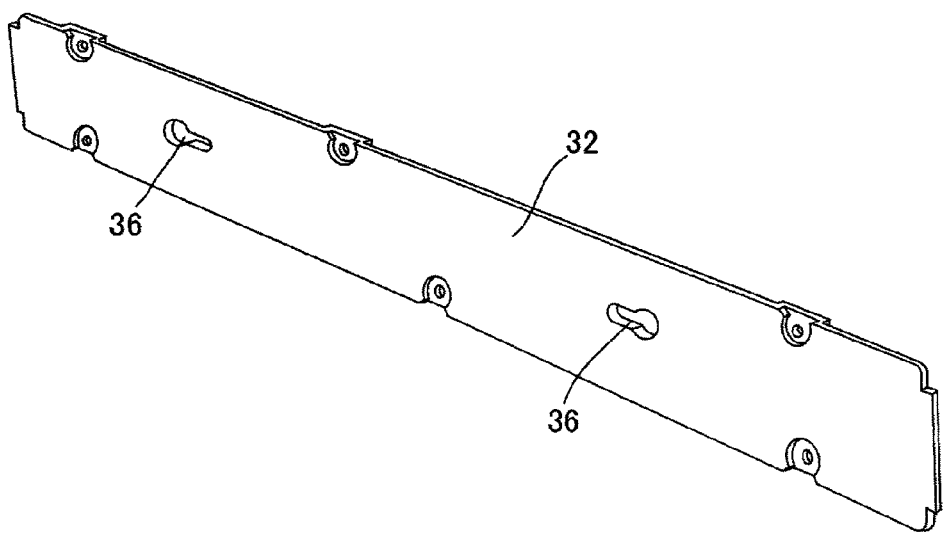
FIG. 30 is an illustrative perspective view schematically showing a surface plate of a lid in the fifth embodiment of a lid for a substrate storage container and a substrate storage container according to the present invention.
Figure 31:
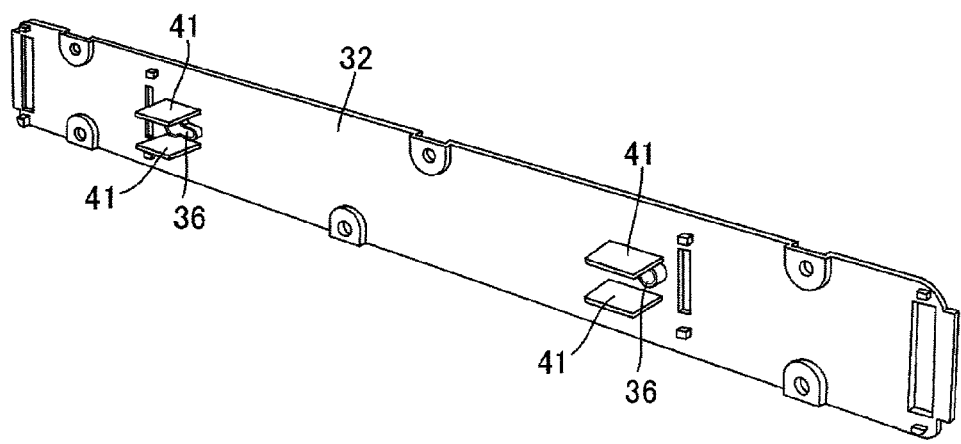
FIG. 31 is an illustrative perspective view schematically showing a rear surface of the surface plate of FIG. 30.

The gasket 50 is molded, as shown in FIGS. 27 through 29, using a molding material that is excellent in, for example, heat resistance, weather resistance, fire retardancy, cold resistance, and compression characteristic, such as silicone rubber and fluororubber, alternatively, using various thermoplastic elastomer (for example, olefin type, or the like) capable of coating diamond-like carbon (also referred to as DLC) 53 therewith, into a elastically deformable, laterally long frame-like shape.

The gasket 50 is provided with a mounting portion 51 having an endless frame-like shape to be fitted into the mounting groove 40 of the lid 30, and a contact portion 52 that is integrally formed with the mounting portion 51, is press-contact to the inner periphery of the opened front portion of the container body 1 and deformed, and the entire surface of the contact portion 52 is coated with hard diamond-like carbon 53, which is excellent in high smoothness, abrasion resistance, corrosion-resistance, low friction coefficient, and high gas barrier property, through batch processing and the like, and this diamond-like carbon 53 is in contact with the inner periphery of the front portion of the container body 1.

Figure 15:
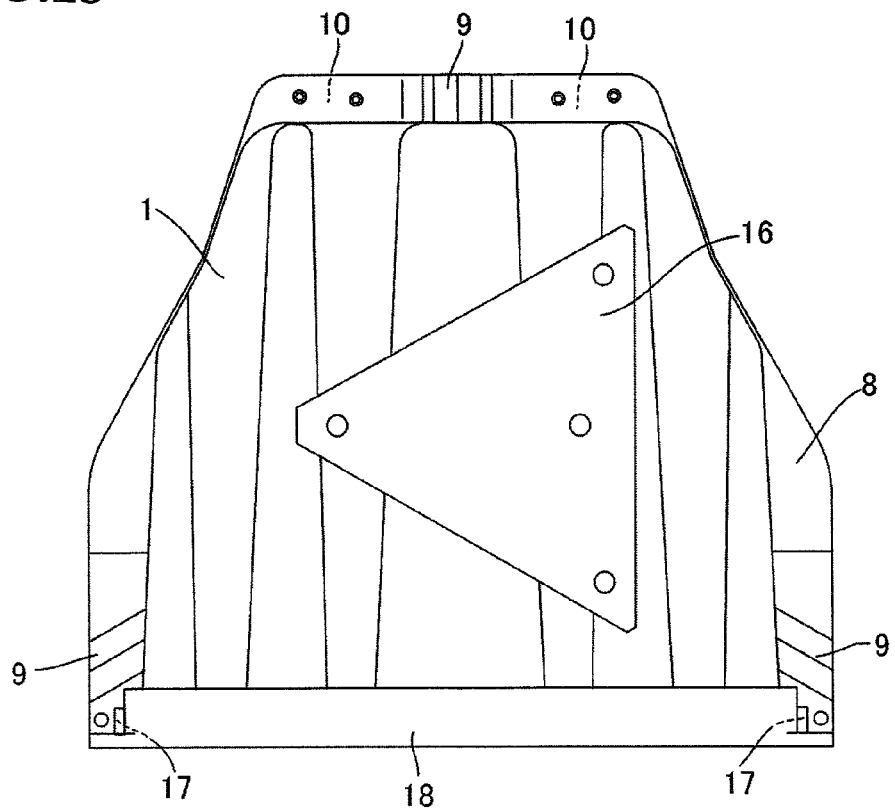
FIG. 15 is an illustrative plan view schematically showing a container body in the fifth embodiment of a lid for a substrate storage container and a substrate storage container according to the present invention.
Figure 16:
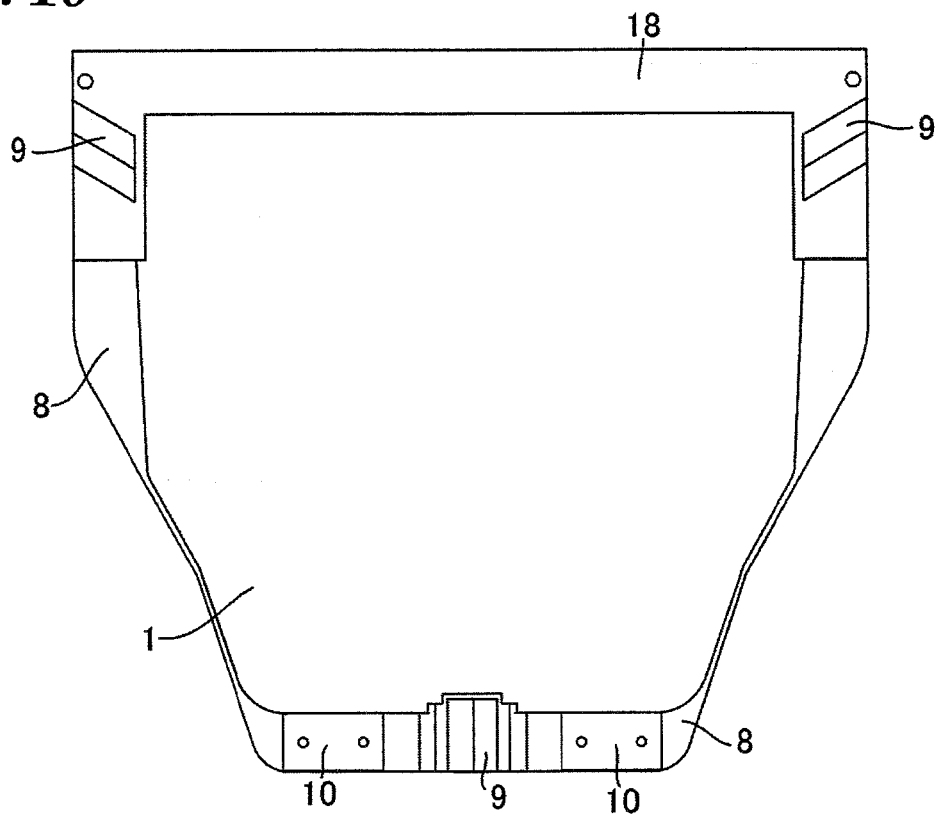
FIG. 16 is an illustrative bottom view of FIG. 15.
Figure 17:
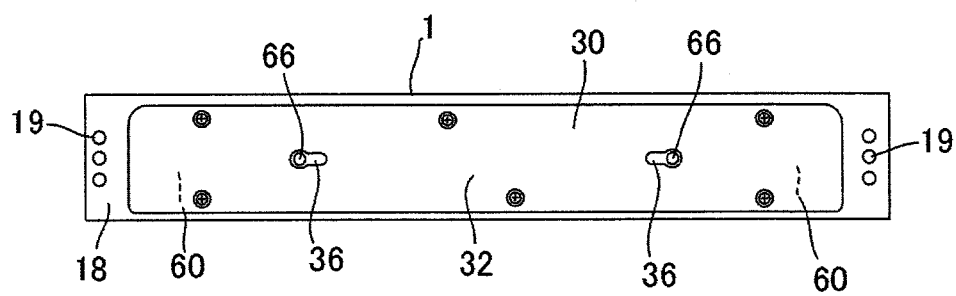
FIG. 17 is an illustrative front view of FIG. 15.

The gasket 50 is, as shown in FIG. 15, formed to have a substantially U-shape section, the both free end portions of which are different in thickness and length and an external free end portion of the both free end portions is extended longer than an inner free end portion. The both free end portions of the gasket 50 are slantingly cut so as to easily deform the inner free end portion, which is thin-walled, fitted tightly into the inside of the mounting groove 40 of the lid 30, while the end surface of the external free end portion, which is thick-walled, is peaked by having a substantially triangle section to comprise a contact portion 52, and other remaining portion than this contact portion 52 comprises the mounting portion 51.

The diamond-like carbon 53, formed into an amorphous hard film by dissociating gas including carbon in plasma into an atomic state, has a characteristic in which the surface is smooth and a crystal grain boundary is included by the dense amorphous structure, and is coated to have a thickness of about 10 to 100 nm in a view point of maintaining flexibility and following capability of the gasket 50.

As shown in FIGS. 17, 20, 30 and 31, a surface plate 32 is formed into laterally long, and on both side portions thereof, operation ports 36 for the locking mechanism 60 are each bored to be laterally long, then on a rear side peripheral edge portion of each operation port 36, a pair of guide pieces 41 for the locking mechanism 60 is integrally formed toward the inner direction of the casing 31.

Figure 25:
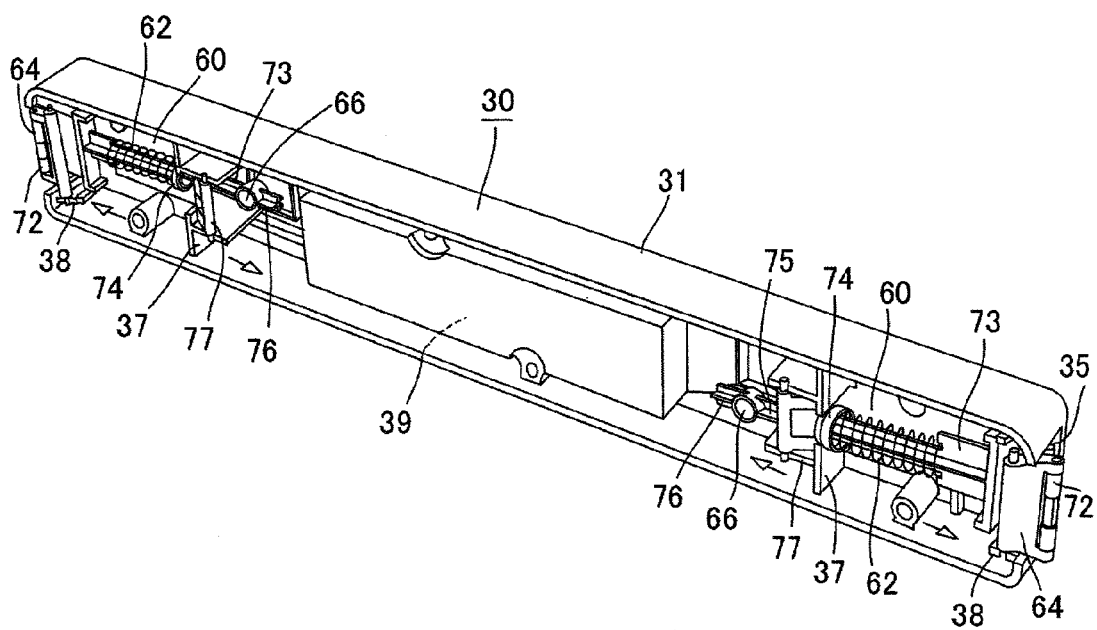
FIG. 25 is an illustrative perspective view schematically showing a lid and a locking mechanism in the fifth embodiment of a lid for a substrate storage container and a substrate storage container according to the present invention.
Figure 32:
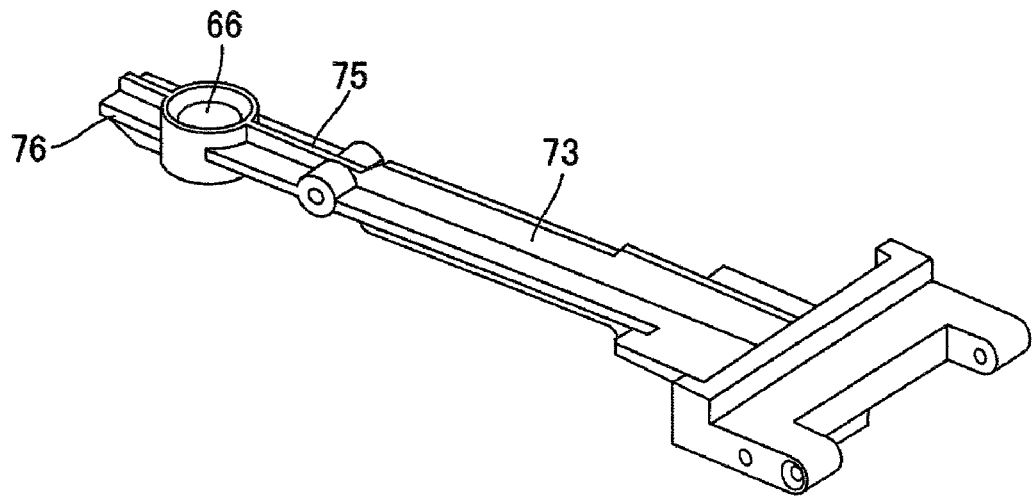
FIG. 32 is an illustrative perspective view schematically showing a sliding plate of a locking mechanism in the fifth embodiment of a lid for a substrate storage container and a substrate storage container according to the present invention.

Each link plate 73 of the locking mechanism 60 is formed, as shown in FIGS. 25 and 32 for example, into a plate of which tip end portion is a biforked, substantially Y-shape, and on a bar-shaped center portion thereof, a collar 74 for the coil spring 62 is slidably fitted into, and an end portion 75 and a most distal end portion 76 thereof are slidably held by the pair of guide pieces 41 of the surface plate 32, and a round operation hole 66 corresponding to the operation port 36 of the surface plate 32 is bored at the most distal end portion 76.

At the end portion 75 of the link plate 73, a substantially U-shaped link arm 77 for regulating sliding and falling off of the collar 74, having a cylindrical shape, is fitted into and pivotally supported through a pin swingably in inward and outward right- and left directions, and the link arm 77 is pivotally supported on a holding rib 37 of the casing 31 through a pin swingably in inward and outward right-and-left directions.

Figure 33:
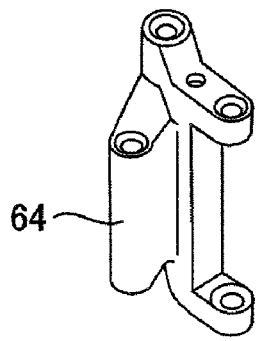
FIG. 33 is an illustrative perspective view schematically showing an engaging claw of a locking mechanism in the fifth embodiment of a lid for a substrate storage container and a substrate storage container according to the present invention.
Figure 34:
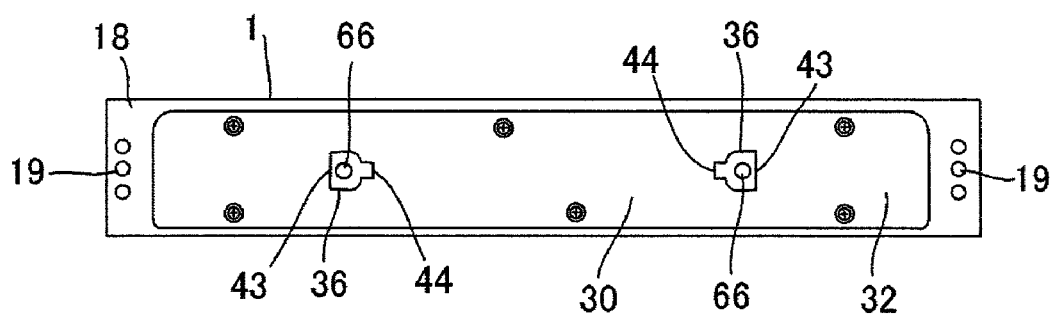
FIG. 34 is an illustrative front view schematically showing a container body in the sixth embodiment of a lid for a substrate storage container and a substrate storage container.
Figure 35:
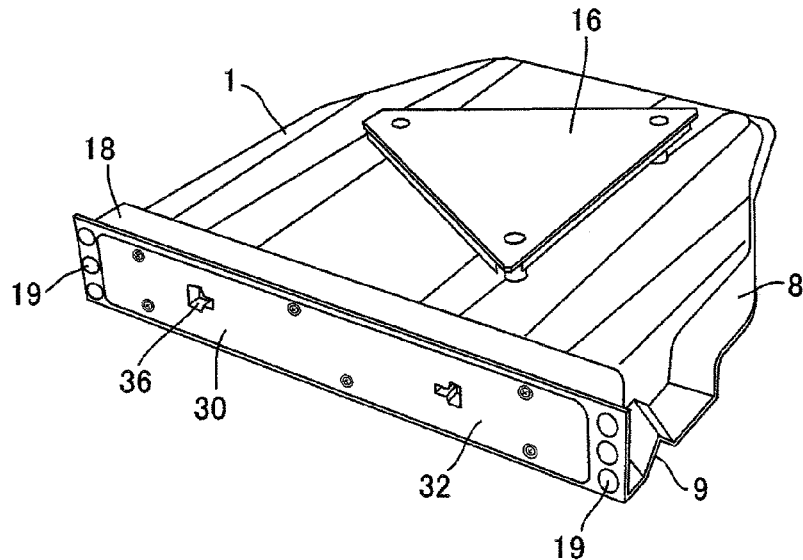
FIG. 35 is an illustrative perspective view schematically showing the sixth embodiment of a lid for a substrate storage container and a substrate storage container according to the present invention.

As shown in FIGS. 25 and 33, each engaging claw 64 is bent-formed into a deformed substantially V-shape, and the bent portion is swingably and pivotally supported by a supporting rib 38 of the casing 31 through a pin. As the engaging claw 64, one end portion thereof is swingably and pivotally supported between the biforked tip end portions of the link plate 73 through a pin, and between biforked another end portion, a plurality of rollers 72, to be in slidingly contact with inside of the engaging groove 17 of the container body 1, are rotatably supported through a pin. Each roller 72 is formed into a cylindrical shape by using a similar material, or the like, to the container body 1, for example.

Each coil spring 62, as shown in FIG. 25, penetrates the center portion of the link plate 73 and interposed between a wide width tip end portion side of the link plate 73 and the collar 74, as well as causing the collar 74 to be in press-contact with the link arm 77, another end portion of the engaging claw 64, that is the plurality of rollers 72 are caused to project to the outside from a through hole 35 of the casing 31.

In the above configuration, when a container body 1 storing a semiconductor wafer W is closed by the lid 30, the lid 30 is pressed and fitted into the opened front portion of the container body 1, and a contact portion 52 of the gasket 50 is press-contacted/deformed to the inner periphery of the front portion of the container body 1 through the diamond-like carbon 53, and the through-hole 35 of the lid 30 is caused to be opposed to each engaging groove 17 of the container body 1.

Then, by the restoration action of each coil spring 62 that have been compressed, the link plate 73 being guided by the holding rib 37, the guide piece 41 and the link arm 77, slides in outward right-and-left direction of the lid 30 horizontally so that the engaging claw 64 is swung in a surface to rear direction of the lid 30, and another end portion of the engaging claw 64 projects to the outside from the through-hole 35 of the lid 30 while drawing an arc so that the plurality of rotatable rollers 72 fit into the engaging groove 17 of the container body 1, and by fitting the plurality of rotatable rollers 72, the front portion of the container body 1 is closed by the lid 30 more firmly, thus ensuring the airtightness and sealability.

As such, when the locking mechanism 60 is under no load being applied, the roller 72 of the engaging claw 64, swingably projecting, rolls and is contactably fitted into each engaging groove 17 of the container body 1, so that the front portion of the container body 1 is covered by the lid 30.

Compared to this, when removing the locked lid 30 from the front portion of the container body 1 storing a semiconductor wafer W, a dedicated jig is inserted into the operation hole 66 of each link plate 73 through the operation port 36 of the lid 30 from the outside, and each link plate 73 is slid into inward right-and-left direction of the lid 30.

Then, each link plate 73 compresses the coil spring 62 and slides in inward right-and-let direction of the lid 30 horizontally, and the engaging claw 64 swings as drawing an arc and exposed another end thereof, that is the plurality of rollers 72, is retracted back into the through-hole 35 of the lid 30, and since another end of the engaging claw 64 is retracted back, the plurality of rollers 72 are come off the engaging groove 17 of the container body 1 and the lid 30 is possible to be removed from the container body 1.

According to the above configuration, when not operating the locking mechanism 60 as the lid 30 is not to be removed from the container body 1, the engaging claw 64 is constantly being fitted into the engaging groove 17 of the container body 1 by the coil spring 62 so that the front portion of the container body 1 is firmly closed by the lid 30, the lid 30 will not come off the container body 1 and there is no risk to cause a trouble in locking the lid 30. In addition, instead of directly fitting the engaging claw 64 into the engaging groove 17 of the container body 1, the plurality of rotatable rollers 72 of the engaging claw 64 are fitted into and slidingly in contact with the engaging groove 17 of the container body 1, the coefficient of friction is to be small so that there is no risk of causing the container body 1 and the engaging claw 64 to be rubbed to generate particles that contaminate the semiconductor wafer W.

Since the diamond-like carbon 53 having high smoothness and abrasion resistance is coated on the contact portion 52 of the gasket 50 opposing the container body 1, even when the gasket 50 is interposed between the container body 1 and the lid 30 for long time, there is no possibility that the gasket 50 is stuck inside the container body 1 so as to cause a trouble in releasing the lid 30. Additionally, modification to increase hardness of the gasket 50 is not needed and thus the following capability of the gasket 50 is ensured so that the air tightness and sealability are able to be improved.

The both side portions of the rib flange 8 of the container body 1 are opposed to the ejection pin 87 of the die 81 from the outside to be an obstacle so that the strength of the rear wall is increased and reinforcing function is exerted, therefore, even when the ejection pin 87 is ejected and great load is applied, the rear surface portion side 23 of the container body 1 will not be broken through by the ejection pin 87 and it is possible to prevent the damage of the container body 1 in manufacturing fairly effectively.

Since the pulling angle in releasing the container body 1 from the die 81 is not required to change largely, pulling in and out of a semiconductor wafer W will not be troubled. Furthermore, since the rib flange 8 of the rear wall and the positioning portion 9 are not formed separately, but the positioning portion 9 is integrally formed on the center portion of the rib flange 8 of the rear wall, thus the simplification of the configuration is greatly expected.

Next, illustrated in FIGS. 34 to 43 is the sixth embodiment of the present invention, and in this case, an operation hole 66 of the locking mechanism 60 for locking the lid 30 is formed into a substantially elliptical shape in front view, and a peripheral edge portion thereof positioned on inward right-and-left direction side of the lid 30 is formed into a linear vertically flat portion 78.

Figure 36:
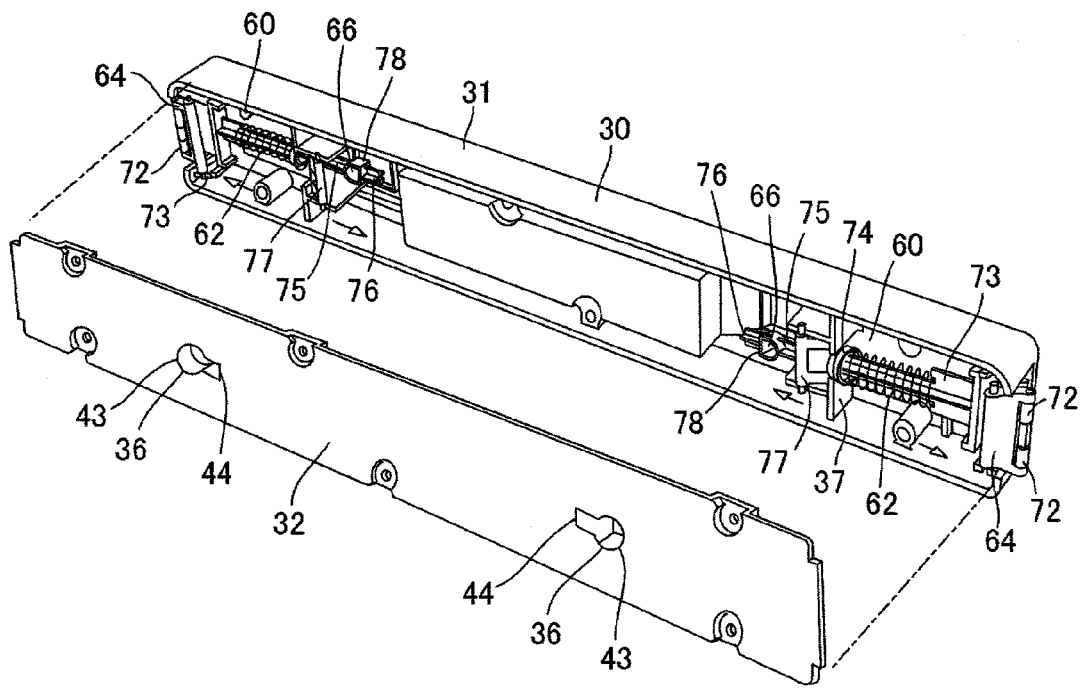
FIG. 36 is an illustrative exploded perspective view schematically showing a lid in the sixth embodiment of a lid for a substrate storage container and a substrate storage container according to the present invention.
Figure 37:
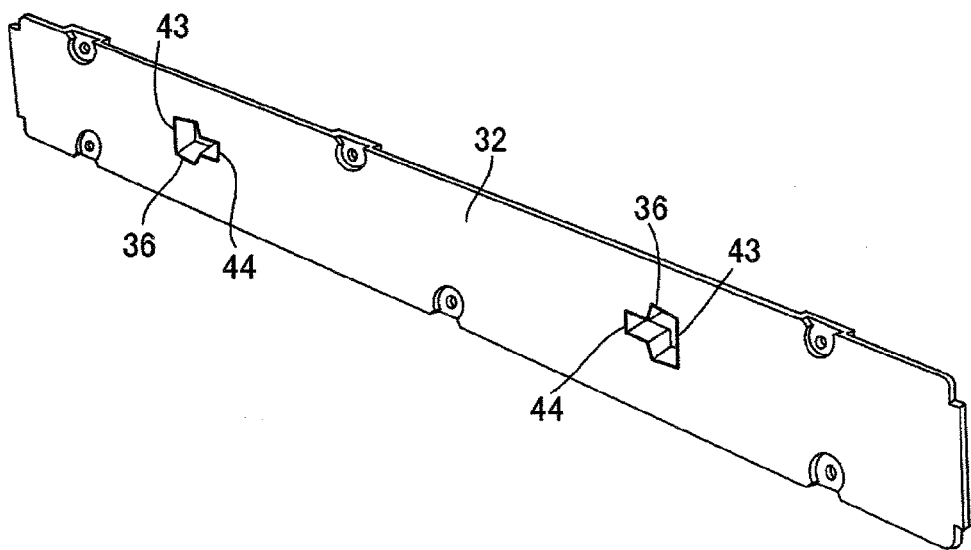
FIG. 37 is an illustrative perspective view schematically showing a surface plate of a lid in the sixth embodiment of a lid for a substrate storage container and a substrate storage container according to the present invention.
Figure 38:
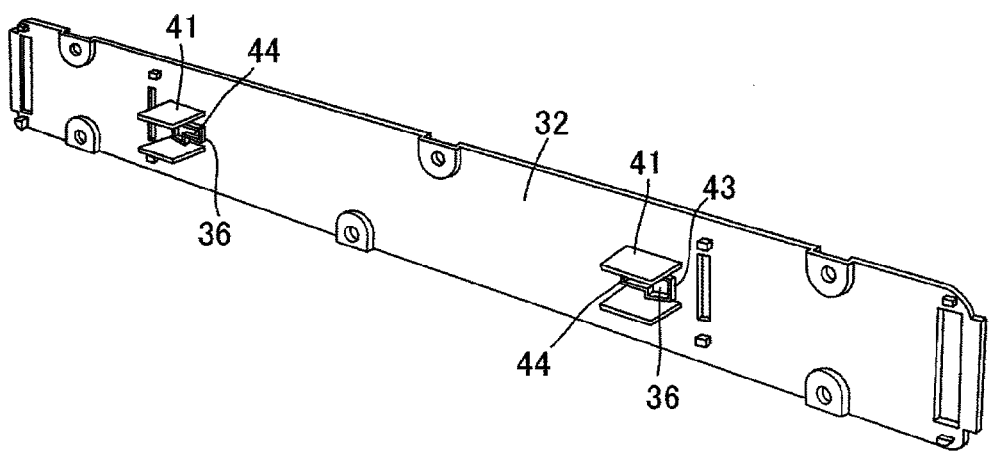
FIG. 38 is an illustrative perspective view schematically showing a rear side of the surface plate of FIG. 37.
Figure 41:
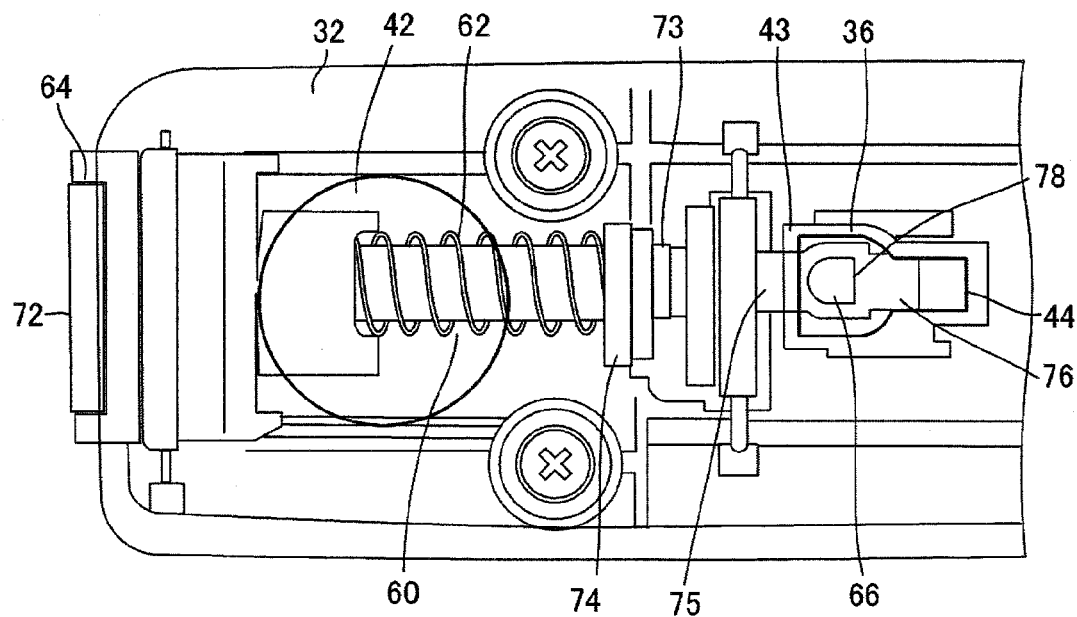
FIG. 41 is an illustrative view schematically showing essential parts of a link plate at a reference position in the sixth embodiment of a lid for a substrate storage container and a substrate storage container according to the present invention.
Figure 42:
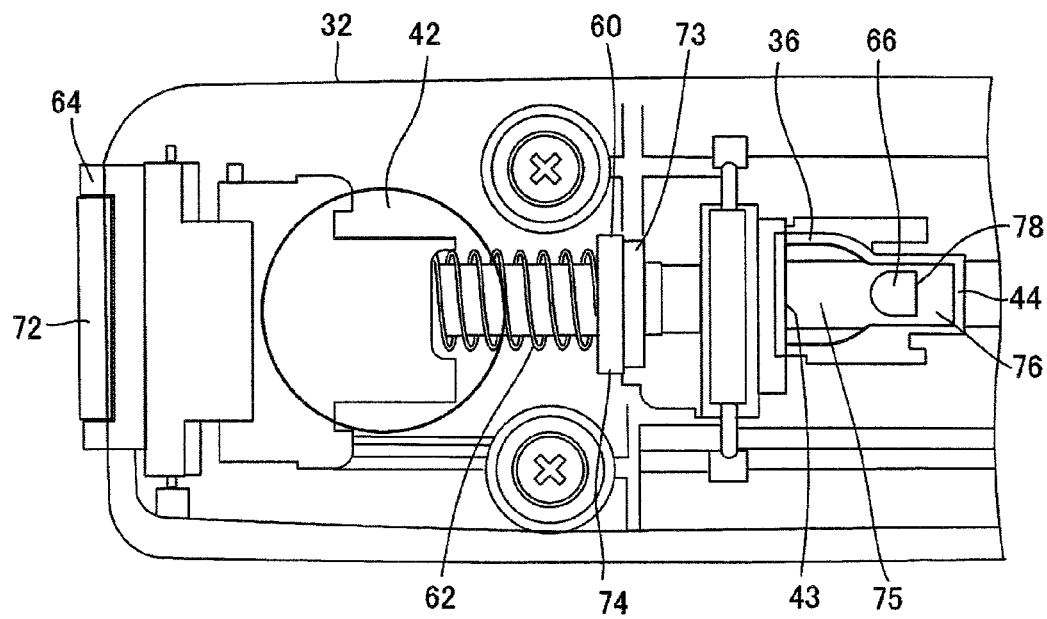
FIG. 42 is an illustrative view schematically showing essential parts of a link plate in a sliding state in the sixth embodiment of a lid for a substrate storage container and a substrate storage container according to the present invention.

The surface plate 32 of the lid 30 is, as shown in FIGS. 36, 41, 42, and the like, formed into a substantially laterally long rectangle, and on each of both side portions thereof, an operation port 36 for the locking mechanism 60 is bored into a substantially convex shape, and on each extreme both side portion, a suction area 42, having a circular shape in front view and vacuum-sucked by the lid opening/closing apparatus, is formed. Each operation port 36 is formed into laterally long and extended in inward and outward right-and-left directions of the lid 30, and the outward right-and-left direction side thereof is formed into a wide width portion 43 with a curved side, and the remaining portion positioned on the inward right-and-left direction side is formed into a rectangular narrow width portion 44, and on a rear side peripheral edge portion thereof, a pair of guide pieces 41 for the locking mechanism 60 are integrally formed to face to the inward direction of the casing 31.

The locking mechanism 60 is configured to be provided with a pair of link plates 73 supported on inner both sides of the casing 31 and capable of sliding in inward and outward right-and-left directions, a pair of swingable engaging claws 64 pivotally supported in each through-hole 35 of the casing 31 so as to be projected from and retracted into and coupled with and supported by the tip end portion of the link plate 73, and fitted into and interfere with an engaging groove 17 of the container body 1, a pair of coil springs 62 fitted into each link plate 73 and cause the engaging claws 64 to interfere with the engaging groove 17 of the container body 1, and an operation hole 66, bored on a most distal end portion 76 side of each link plate 73, and to which each operation pin 90 is inserted from the outside of the lid 30.

Each link plate 73 is formed into, for example, a substantially Y-shape plate of which tip end portion is biforked, and a collar 74 which is a cylindrical body for the coil spring 62 is slidably fitted into a stick shape center portion, and the end portion 75 and the most distal end portion 76 are slidably held by the pair of guide piece 41 of the surface plate 32, and at the most distal end portion 76, an operation hole 66, having a substantially semi-elliptical shape in front view and opposing the operation port 36 of the surface plate 32, is bored.

At the end portion 75 of the link plate 73, a link arm 77 which is a substantially U-shaped arm for regulating sliding and falling off of the collar 74, is fitted into and pivotally supported through a pin swingably in inward and outward right-and-left directions, and the link arm 77 is pivotally supported by the holding rib 37 of the casing 31 through a pin swingably in inward and outward right-and-left directions.

Figure 40:
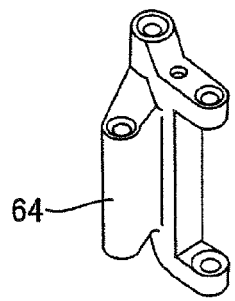
FIG. 40 is an illustrative perspective view schematically showing an engaging claw of a locking mechanism in the sixth embodiment of a lid for a substrate storage container and a substrate storage container according to the present invention.

Each engaging claw 64 is bent-formed into a deformed substantially V-shape as shown in FIG. 40, and a bent portion is pivotally supported by the supporting rib 38 of the casing 31 through a pin swingably. As the engaging claw 64, one end portion thereof is pivotally supported between tip end portions of the biforked link plate 73 through a pin swingably, and between the biforked another end portion, a plurality of rollers 72 each of which slidingly in contact with the engaging groove 17 of the container body 1, are rotatably supported through a pin. Each roller 72 is formed into a cylindrical shape using the similar material to the container body 1, for example.

Each coil spring 62 is fitted as penetrating the center portion of the link plate 73 and interposed between the wide width tip end portion side of the link plate 73 and the collar 74, as well as causing the collar 74 to be in press-contact with the link arm 77, causing another end portion of the engaging claw 64, that is the plurality of rollers 72, to project from the through-hole 35 of the casing 31 to the outside.

Figure 39:
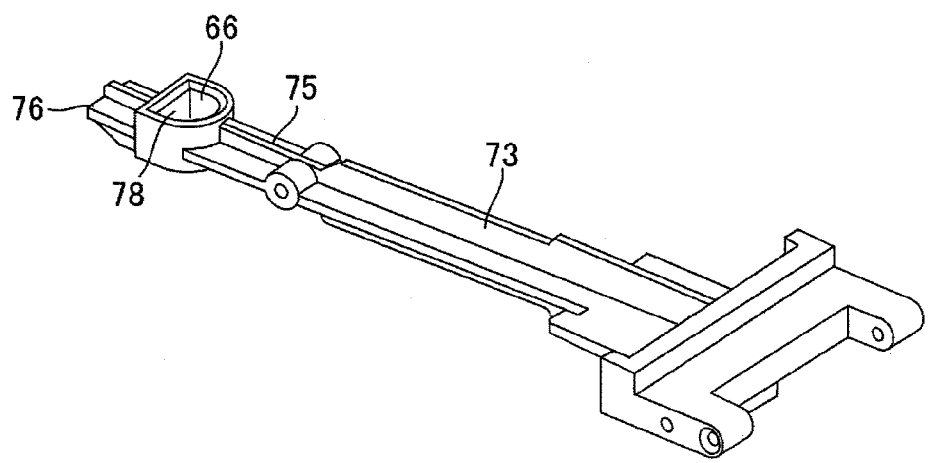
FIG. 39 is an illustrative perspective view schematically showing a link plate of a locking mechanism in the sixth embodiment of a lid for a substrate storage container and a substrate storage container according to the present invention.

Each operation hole 66 is, as shown in FIGS. 39, 41, and 42, basically formed into a substantially elliptical shape in front view, and the peripheral edge portion positioned on inward right-and-left direction side of the lid 30 is cut out as vertically flat portion 78 into top to bottom linear direction, and the operation pin 90 is in contact with the vertically flat portion 78 when removing the lid 30.

Figure 43:
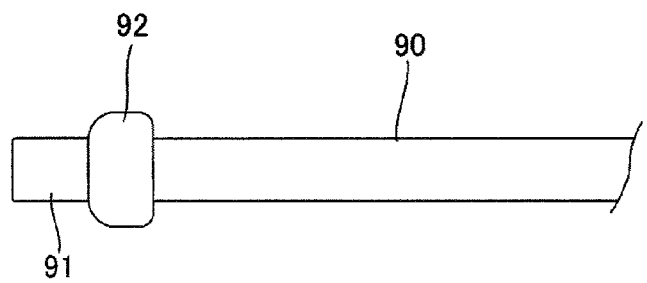
FIG. 43 is an illustrative view schematically showing an operation pin in the sixth embodiment of a lid for a substrate storage container and a substrate storage container according to the present invention.

Each operation pin 90 is, as shown in FIG. 43, provided with a pin portion 91 of an elongated cylindrical shape, and an extended portion 92 integrally molded with the pin portion 91 and bulged radially outwards, and operated automatically or manually. The operation pin 90 functions so that the pin portion 91 is inserted into the operation hole 66 of the link plate 73 by penetrating the operation port 36 and thus the bulged portion 92 is in contact with/interferes with the operation port 36 of the surface plate 32 appropriately to support the lid 30.

In the above configuration, when the opened front portion of the container body 1 is closed by the lid 30, the lid 30 is pressed and fitted into the front portion of the container body 1 by the lid opening/closing apparatus, and a contact portion 52 of the gasket 50 is press-contacted/deformed to the inner periphery of the front portion of the container body 1 through the diamond-like carbon 53, and the through-hole 35 of the lid 30 is opposed to each engaging groove 17 of the container body 1.

Then, by a restoration action of each coil spring 62 that have been compressed, the link plate 73 being guided by the holding rib 37, the guide piece 41 and the link arm 77, slides in outward right-and-left direction of the lid 30 horizontally so that the engaging claw 64 is swung in a surface to rear direction of the lid 30, and another end portion of the engaging claw 64 projects to the outside from the through-hole 35 of the lid 30 while drawing an arc so that the plurality of rotatable rollers 72 are fitted into the engaging groove 17 of the container body 1, and by fitting the plurality of rotatable rollers 72, the front portion of the container body 1 is closed by the lid 30 more firmly, thus ensuring the airtightness and sealability.

Compared to this, when removing the locked lid 30 from the front portion of the container body 1, the operation pin 90 is inserted into each operation hole 66 of the pair of link plates 73 (see FIG. 41) through the operation port 36 of the lid 30 from the outside, and by moving each operation pin 90 in a direction from the wide width portion 43 to the narrow width portion 44 of the operation port 36, each link plate 73 is slid in inward right-and-left direction of the lid 30 (see FIG. 42).

Then, each link plate 73 horizontally slides in inward right-and-left direction of the lid 30 while compressing the coil spring 62, and the engaging claw swings as drawing an arc and causes the exposed another end thereof, that is the plurality of rollers 72 to be retracted back in the through-hole 35 of the lid 30, and since another end of the engaging claw 64 is retracted back, the plurality of rollers 72 are come off the engaging groove 17 of the container body 1 and the lid 30 is possible to be removed from the container body 1.

According to the above configuration, when the link plate 73 causes the engaging claw 64 to be retracted back in the through-hole 35 of the lid 30 and the locking mechanism 60 is slid into the unlock direction, each operation hole 66 is not formed into round circular shape, but formed into a substantially semi-elliptic shape of which contact face in contact with the operation pin 90 positioned on the unlock direction side is a flat vertically flat portion 78, therefore causing a trouble in fitting the lid 30 is able to be prevented.

Figure 44:
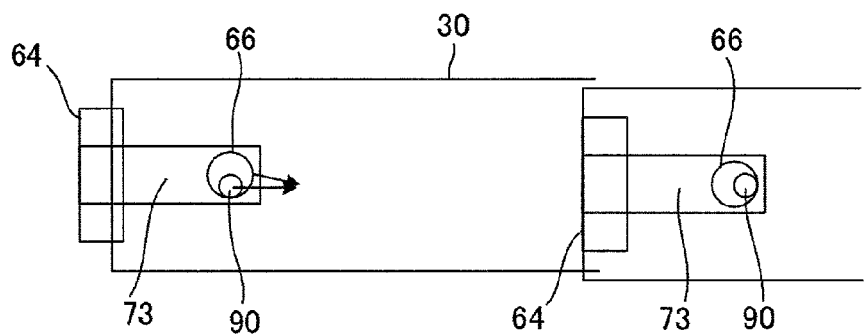
FIG. 44 is an illustrative view schematically showing problems with a round operation hole in the sixth embodiment of a lid for a substrate storage container and a substrate storage container according to the present invention.

To explain this point further, when the operation hole 66 is for example a circular shape, to remove the lid 30 from the container body 1, the operation pin 90 is inserted into the operation hole 66 of the link plate 73, and the link plate 73 is slid into inward right-and-left direction of the lid 30 (see left side of FIG. 44), so that the operation pin 90 is moved off to the lower portion of the peripheral edge of the operation hole 66 to be in press-contact with and depresses the lid 30 below (see right side of FIG. 44), and after removing the lid 30 from the container body 1 under this state, the container body 1 is restored to an original position.

Then, after that, at the front portion of the container body 1 which is restored to the original position, the lid 30 is fitted into again, and at this time, the lid 30 being depressed below the front portion of the container body 1 will collide therewith (see right side of the same figure), and the lid 30 will not be able to be fitted into smoothly because of the positional deviation.

Figure 45:
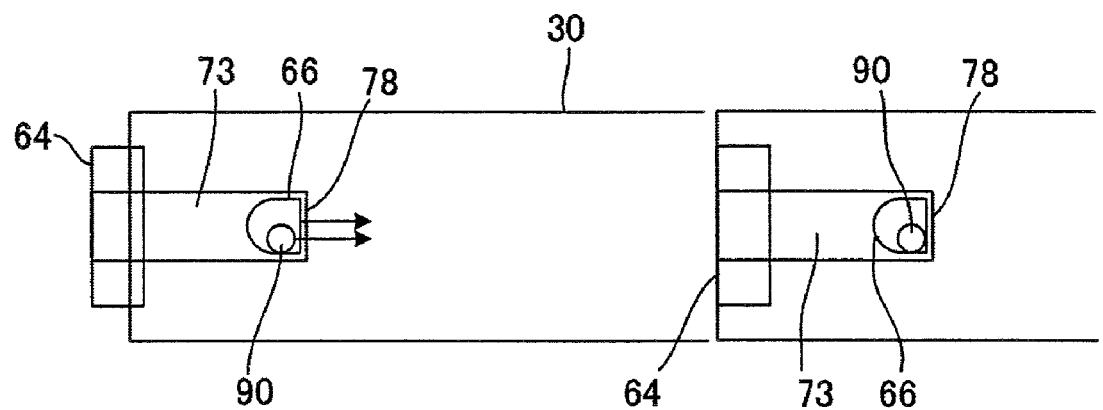
FIG. 45 is an illustrative view schematically showing effects of the operation hole in the sixth embodiment of a lid for a substrate storage container and a substrate storage container according to the present invention.

Compared to this, according to the present embodiment, the operation hole 66 has a semi-elliptic shape, and since the vertically flat portion 78 positioned on the unlock direction side of the locking mechanism 60 exerts the rattling prevention function to the operation pin 90, even when the positions of the operation hole 66 of the link plate 73 and the operation pin 90 are relatively deviated in top to bottom direction, the link plate 73 is able to be slid in inward right-and-left direction of the lid 30 at the set position so that the lid 30 is smoothly fitted into the container body 1 (See FIG. 45).

Since the bulged portion 92 of the operation pin 90 is in contact with the operation port 36 of the surface plate 32 and exerts supporting function, even when the lid 30 is not vacuum-sucked appropriately by the lid opening/closing apparatus, falling off the lid 30 is not caused and holding of the lid 30 without fail is greatly expected.

Figure 46:
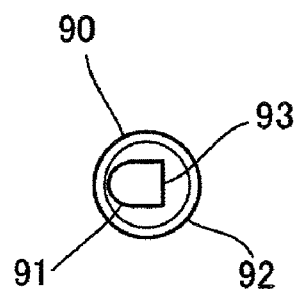
FIG. 46 is an illustrative view schematically showing the seventh embodiment of a lid for a substrate storage container and a substrate storage container according to the present invention.

Next, FIG. 46 shows a seventh embodiment of the present invention, and in this case, the operation pin 90 to be inserted into the operation hole 66 of each link plate 73 is formed by the pin portion 91 of an elongated columnar shape and a bulged portion 92 which is integrally molded with the pin portion 91 and bulged outwards in the width direction, and a part of the pin portion 91 is formed into a substantially similar figure, that is a substantially semi-elliptical section, corresponding to the operation hole 66 of the link plate 73 and the vertically flat surface 93 of the pin portion 91 is formed into smaller and shorter than the vertically flat portion 78 of the operation hole 66. Other parts are substantially similar to the above embodiments and the description will be omitted.

In this embodiment, the similar action and effects to the above embodiments are expected, and since the shape of a part of the pin portion 91 and that of the operation hole 66 are similar, it is obvious that deformation of the operation hole 66 accompanied by the repeated attaching and detaching operation of the lid 30 is able to be prevented effectively.

Note that, in the above embodiments, two sheets of semiconductor wafer W are stored in the container body 1 but not limited thereto, and one sheet of or three sheets of semiconductor wafers W may be stored. Additionally, as long as similar action and effects are able to be expected, a fitting groove 3 which does not connect with both side walls and an inner bottom surface may be recessed and formed. The container body 1 and the teeth body 2 may be integrated. The container 1 and the rib flange 8 may be integrated, or each may be a separate body. The hanging flange 16 may be formed into a planar circular shape, a polygonal shape, or the like, and may be detachably attached to both side walls, etc., of the container body 1.

Furthermore, the rear portion and the center portion of the plurality of pairs of teeth 4 may be coupled with the coupling piece 5 when this will not particularly cause a trouble. In the above embodiment, although the engaging groove 17 is formed on both side portions of the inner periphery of the front portion of the container body 1, but not limited thereto, and for example, the engaging groove 17 may be formed on the four corners of the inner periphery of the front portion of the container body 1, and the through-hole 35 for the driving mechanism 60 may be bored on the four corners of the peripheral wall of the casing 31 so that the engaging claw 64 of the advance/retreat engaging body 61 is caused to project from each through-hole 35.

The engaging groove 17 may be formed on two corners on the diagonal lines of the inner peripheral surface of the front portion of the container body 1, and the through-hole 35 for the driving mechanism 60 may be bored on two corners of the peripheral wall on the diagonal lines of the casing 31 so that the engaging claw 64 of the advance/retreat engaging body 61 is capable of projecting from each through-hole 35. The regulating stopper 68 for regulating excessive advance of the driving member 63 by being in contact with the regulated pin projected from the casing 31 may be formed on both side portions, a side portion, or the like, of the driving member 63, but not on the end portion 75 thereof.

When causing each advance/retreat engaging body 61 to slide in inward and outward right-and-left directions of the lid 30, sliding of which may be performed while inclining it into the thickness direction of the casing 31. In this embodiment, the coil spring 62 is caused to penetrate the driving member 63, but not limited thereto. For example, the casing 31, and the driving member 63 or the engaging claw 64 are coupled with a required number of spring members, and the engaging claw 64 may be resiliently urged so as to be retracted into and projected from the through-hole 35 of the casing 31 by the spring member. The required number of roller 72 may be rotatably and pivotally supported by the edge portion of the engaging claw 64 of the first embodiment.

Furthermore, instead of forming the plurality of positioning portions 9 on the rib flange 8, a positioning portion 9 corresponding to the semiconductor processing apparatus or the lid opening/closing apparatus may be provided on front both sides and rear center of the flat bottom surface of the container body 1, respectively. Furthermore the center portion of the rib flange 8 of the rear wall may be bent-formed into a recessed portion which is a substantially V-shape, but not to be a substantially W-shape. Additionally, the rib flange 8 of each side wall may be omitted when this will not cause any trouble.

In addition, the diamond-like carbon 53 is coated only on the contact portion 52 of the gasket 50, but not particularly limited thereto, and the diamond-like carbon 53 may be coated on both the mounting portion 51 and the contact portion 52 of the gasket 50 respectively. Additionally, although the diamond-like carbon 53 may be simply coated on the contact portion 52 of the gasket 50, the diamond-like carbon 53 may be partly coated on the contact portion 52 of the gasket 50 when this will not cause any trouble.

Furthermore, when similar action and effects are expected, the operation port 36 which is a substantially trapezoidal shape in front view may be bored on the surface plate 32. Additionally, although the operation hole 66 of the link plate 73 may have a substantially semi-elliptical shape in front view, or it may have a substantially semi-oval shape in front view, a substantially semicircular shape in front view, or the like.

The invention claimed is:

1. A lid for a substrate storage container comprising:
a locking mechanism, provided in the lid for opening and closing an opened front portion of a container body which stores a substrate of three sheets or less, for locking the lid fitted into the front portion of the container body,
wherein the locking mechanism is supported by the lid which is substantially laterally long when viewed from the front, and includes a sliding body capable of sliding in inward and outward right-and-left directions thereof, an engaging claw supported so as to be projected to and retracted from in a vicinity of a through hole on a side wall of the lid, rotatably coupled with a tip end portion of the sliding body, projecting from the through hole of the lid and capable of interfering with an inner periphery of the front portion of the container body, a spring member that causes the sliding body to slide into outward right-and-left direction of the lid and thus causes the engaging claw to project from the through hole of the lid, and an operation hole provided on an end portion side of the sliding body and operated from the outside;

wherein the operation hole of the sliding body is formed into a substantially circular shape and a part positioned on inward right-and-left direction side of the lid is formed into a linear, vertically flat portion, and when the lid is removed from the front portion of the container body, the sliding body is caused to slide in the inward right-and-left direction of the lid by inserting an operation pin to the operation hole of the sliding body so that the projecting engaging claw is retracted into the through hole of the lid; and wherein the operation pin includes a pin portion which is a substantially columnar shape and to be inserted into the operation hole of the sliding body, and a bulged portion formed on the pin portion and bulged outwards in a width direction and interferes with the operation port of the lid.

2. The lid for a substrate storage container according to claim 1, wherein a guide, which guides by holding the sliding body of the locking mechanism in inward and outward right-and-left directions of the lid, is formed inside the lid.

3. The lid for a substrate storage container according to claim 1, wherein the locking mechanism further includes a cylindrical body that is slidably fitted into the sliding body, and an arm that is rotatably coupled with the sliding body, supported by the lid and rotating in inward and outward right-and-left directions of the lid, and the spring member is interposed between a tip end portion side of the sliding body and the cylindrical body so that the cylindrical body is caused to be in contact with the atm.

4. The lid for a substrate storage container according to claim 1, wherein a roller is caused to be rotatably supported by an interfering portion of the engaging claw which interferes with the inner periphery of the front portion of the container body, and when the lid is removed from the front portion of the container body, the sliding body is caused to slide in inward right-and-left direction of the lid by operating the operation hole of the sliding body so that the projecting engaging claw is retracted into the through hole of the lid.

5. The lid for a substrate storage container according to claim 1, wherein an operation port of the lid is formed into laterally long extending in inward and outward right-and-left directions of the lid, and outward right-and-left direction side thereof is formed into a wide width portion, and an remaining portion positioned on inward right-and-left direction side is formed into a narrow width portion.

6. The lid for a substrate storage container according to claim 1, wherein the operation pin includes a pin portion which is to be inserted into the operation hole of the sliding body and a bulged portion formed on the pin portion and bulged outwards in a width direction and interferes with the operation port of the lid, and a part of the pin portion is formed into a shape corresponding to the operation hole of the sliding body.

7. A substrate storage container comprising a container body that stores a substrate of three sheets or less, and the lid for a substrate storage container according to claim 1 which opens and closes the opened front portion, substantially laterally long when viewed from the front, of the container body.

* * * * *